United States Patent
Inoue et al.

(10) Patent No.: US 8,350,643 B2
(45) Date of Patent: Jan. 8, 2013

(54) HIGH FREQUENCY DEVICE, FILTER, DUPLEXER, COMMUNICATION MODULE, AND COMMUNICATION APPARATUS

(75) Inventors: Shogo Inoue, Kawasaki (JP); Jun Tsutsumi, Kawasaki (JP); Motoaki Hara, Kawasaki (JP); Masufumi Iwaki, Kawasaki (JP); Takashi Matsuda, Kawasaki (JP); Masanori Ueda, Yokohama (JP)

(73) Assignee: Taiyo Yuden Co., Ltd., Tokyo (JP)

( * ) Notice: Subject to any disclaimer, the term of this patent is extended or adjusted under 35 U.S.C. 154(b) by 502 days.

(21) Appl. No.: 12/571,205

(22) Filed: Sep. 30, 2009

(65) Prior Publication Data

US 2010/0194494 A1     Aug. 5, 2010

(30) Foreign Application Priority Data

Jan. 30, 2009   (JP) ................. 2009-020357

(51) Int. Cl.
  *H03H 7/42*   (2006.01)
  *H03H 7/46*   (2006.01)
  *H03H 9/70*   (2006.01)
(52) U.S. Cl. ........... 333/132; 333/133; 333/25; 333/193
(58) Field of Classification Search ............ 333/25, 333/132–134, 189–195
  See application file for complete search history.

(56) References Cited

U.S. PATENT DOCUMENTS

| | | | |
|---|---|---|---|
| 6,714,099 B2 | 3/2004 | Hikita et al. | |
| 6,803,835 B2 * | 10/2004 | Frank | .............. 333/26 |
| 7,102,460 B2 * | 9/2006 | Schmidhammer et al. | ... 333/133 |
| 7,199,684 B2 | 4/2007 | Aigner et al. | |
| 7,554,419 B2 | 6/2009 | Inoue et al. | |
| 2002/0140520 A1 | 10/2002 | Hikita et al. | |
| 2003/0042992 A1 | 3/2003 | Frank | |
| 2003/0128081 A1* | 7/2003 | Ella et al. | ................ 333/133 |
| 2005/0212619 A1* | 9/2005 | Aigner et al. | ................ 333/189 |
| 2007/0268092 A1 | 11/2007 | Inoue et al. | |

FOREIGN PATENT DOCUMENTS

| | | | | |
|---|---|---|---|---|
| EP | 1 246 358 A2 | 10/2002 | | |
| JP | 6-61783 | * | 3/1994 | .............. 333/193 |
| JP | 2000-114917 | * | 4/2000 | |
| JP | 2002-359542 A | 12/2002 | | |
| JP | 2003-338723 A | 11/2003 | | |
| JP | 2005-535264 A | 11/2005 | | |
| JP | 2007-312324 A | 11/2007 | | |
| KR | 10-2007-0112721 A | 11/2007 | | |

OTHER PUBLICATIONS

Japanese Office Action dated May 12, 2011, in a counterpart Japanese patent application No. 2009-020357 citing Foreign Patent document Nos. 1-2 listed above and JP2002-359542, which has been submitted in a previous IDS. Partial translation of the Office Action is attached as a concise explanation of relevance.
Chinese Office Action dated Jun. 1, 2012 in a counterpart Chinese patent application No. 200910174902.6.
Chinese Office Action dated Sep. 6, 2012 in a counterpart Chinese patent applicaton No. 200910174902.6.

\* cited by examiner

*Primary Examiner* — Barbara Summons
(74) *Attorney, Agent, or Firm* — Chen Yoshimura LLP

(57) ABSTRACT

In a high frequency device, resonators (IDT capacitors) that function as capacitors are included in a lumped constant balun included in a filter or duplexer, and furthermore, the resonance frequency of the IDT capacitors is set higher than the passband frequency of the filter. This improves the capacitor Q value, thus enabling the realization of a low-loss balance filter.

11 Claims, 26 Drawing Sheets

HIGH FREQUENCY DEVICE, FILTER, DUPLEXER, COMMUNICATION MODULE, AND COMMUNICATION APPARATUS

CROSS-REFERENCE TO RELATED APPLICATION

This application is based upon and claims the benefit of priority of the prior Japanese Patent Application No. 2009-20357 filed on Jan. 30, 2009, the entire contents of which is incorporated herein by reference.

FIELD

This disclosure of the present invention relates to a high frequency device, a filter, a duplexer, a communication module, and a communication apparatus.

BACKGROUND

JP 2000-114917A and JP 2002-359542A disclose filters that enable a reduction in the size and cost of balance filters by substituting the capacitors included in the lumped constant balun with acoustic wave resonators. JP 2000-114917A and JP 2002-359542A disclose balance filter.

In order to reduce the power consumption of mobile phone terminals, there is strong demand for the balance filter included in mobile phone terminals to have a low insertion loss characteristic. In order to achieve low-loss in the balance filter illustrated in FIG. 7, it is necessary to reduce the loss of the ladder filter itself or reduce the loss of the lumped constant balun. In order to reduce the loss of the lumped constant balun, it is necessary to improve the Q value (quality factor) of the inductors and capacitors included in the lumped constant balun. However, neither JP 2000-114917A nor JP 2002-359542A discloses a desirable design for the IDT capacitors in order to improve their Q value. It has therefore been difficult to realize a low-loss balance filter using IDT capacitors that have a high Q value.

SUMMARY

A high frequency device according to the present invention is a high frequency device including: a conversion circuit that converts unbalanced input to balanced output; and a filter circuit connected to the balanced output of the conversion circuit, wherein the conversion circuit includes an inductor and a resonator, and the resonance frequency of the resonator included in the conversion circuit is higher than the passband frequency of the filter circuit.

Additional objects and advantages of the invention will be set forth in part in the description which follows, and in part will be obvious from the description, or may be learned by practice of the invention. The object and advantages of the invention will be realized and attained by means of the elements and combinations particularly pointed out in the appended claims.

It is to be understood that both the foregoing general description and the following detailed description are exemplary and explanatory only and are not restrictive of the invention, as claimed.

DESCRIPTION OF EMBODIMENT

Figure 1:
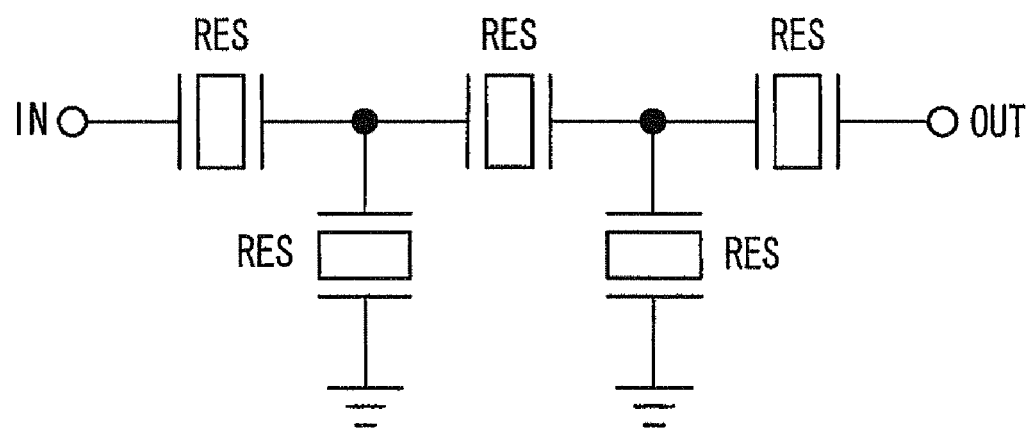
FIG. 1 is a circuit diagram of ladder filter.

A high frequency device according to the present embodiment is a high frequency device including: a conversion circuit that converts unbalanced input to balanced output; and a filter circuit connected to the balanced output of the conversion circuit, wherein the conversion circuit includes an inductor and a resonator, and the resonance frequency of the resonator included in the conversion circuit is higher than the passband frequency of the filter circuit.

The high frequency device according to the present embodiment can be modes such as the following, which are based on the above configuration.

Specifically, a configuration is possible in which, in the high frequency device, the relationship $FR > 1.138 \times F_{UP}$ is satisfied, $F_{UP}$ being the passband upper end frequency of the filter circuit, and FR being the resonance frequency of the resonator included in the conversion circuit.

Also, a configuration is possible in which, in the high frequency device, the filter circuit includes one or more series resonators that are series-connected to a signal line, and one or more parallel resonators that are parallel-connected to the signal line, and the relationship $\lambda_{IDT} > 1.138 \times \lambda_{cap}$ is satisfied, $\lambda_{IDT}$ being the grating pitch of among the one or more series resonators, the series resonator having the widest grating pitch, and $\lambda_{cap}$ being the grating pitch of the resonator included in the conversion circuit.

A filter according to the present embodiment is a filter including: a ladder filter in which a plurality of resonators are connected in a ladder configuration between an unbalanced input terminal and an unbalanced output terminal; a conversion circuit including an unbalanced input terminal connected to the unbalanced output terminal of the ladder filter, a balanced output terminal, and an inductor and a resonator that are connected between the unbalanced input terminal and the balanced output terminal; and a lattice filter including a balanced input terminal connected to the balanced output terminal of the conversion circuit, a balanced output terminal, and a plurality of resonators that are connected in a lattice configuration between the balanced input terminal and the balanced output terminal, wherein the resonance frequency of the resonator included in the conversion circuit is higher than the passband frequency of the ladder filter and the lattice filter.

A duplexer according to the present embodiment is a duplexer including: a reception filter that extracts a signal in a predetermined frequency band from a reception signal received as input; a transmission filter that extracts a signal in a predetermined frequency band for external output; and a matching circuit that matches the phase of a signal on the reception filter side and the phase of a signal on the transmission filter side, wherein the reception filter includes: a ladder filter in which a plurality of resonators are connected in a ladder configuration between an unbalanced input terminal and an unbalanced output terminal; a conversion circuit including an unbalanced input terminal connected to the unbalanced output terminal of the ladder filter, a balanced output terminal, and an inductor and a resonator that are connected between the unbalanced input terminal and the balanced output terminal; and a lattice filter including a balanced input terminal connected to the balanced output terminal of the conversion circuit, a balanced output terminal, and a plurality of resonators that are connected in a lattice configuration between the balanced input terminal and the balanced output terminal, and the resonance frequency of the resonator included in the conversion circuit is higher than the passband frequency of the ladder filter and the lattice filter.

A communication module according to the present invention is a communication module including a transmission filter and a reception filter, wherein at least one of the transmission filter and the reception filter includes: a conversion circuit that converts unbalanced input to balanced output; and a filter circuit connected to the balanced output of the conversion circuit, the conversion circuit includes an inductor and a resonator, and the resonance frequency of the resonator included in the conversion circuit is higher than the passband frequency of the filter circuit.

A communication apparatus according to the present invention is a communication apparatus including a transmission filter and a reception filter, wherein at least one of the transmission filter and the reception filter includes: a conversion circuit that converts unbalanced input to balanced output; and a filter circuit connected to the balanced output of the conversion circuit, the conversion circuit includes an inductor and a resonator, and the resonance frequency of the resonator included in the conversion circuit is higher than the passband frequency of the filter circuit.

Embodiment

[1. High Frequency Device Configuration]

Figure 2A:
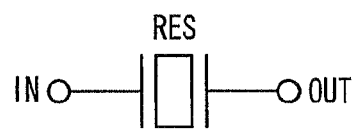
FIG. 2A is a circuit diagram of a filter.
Figure 2B:
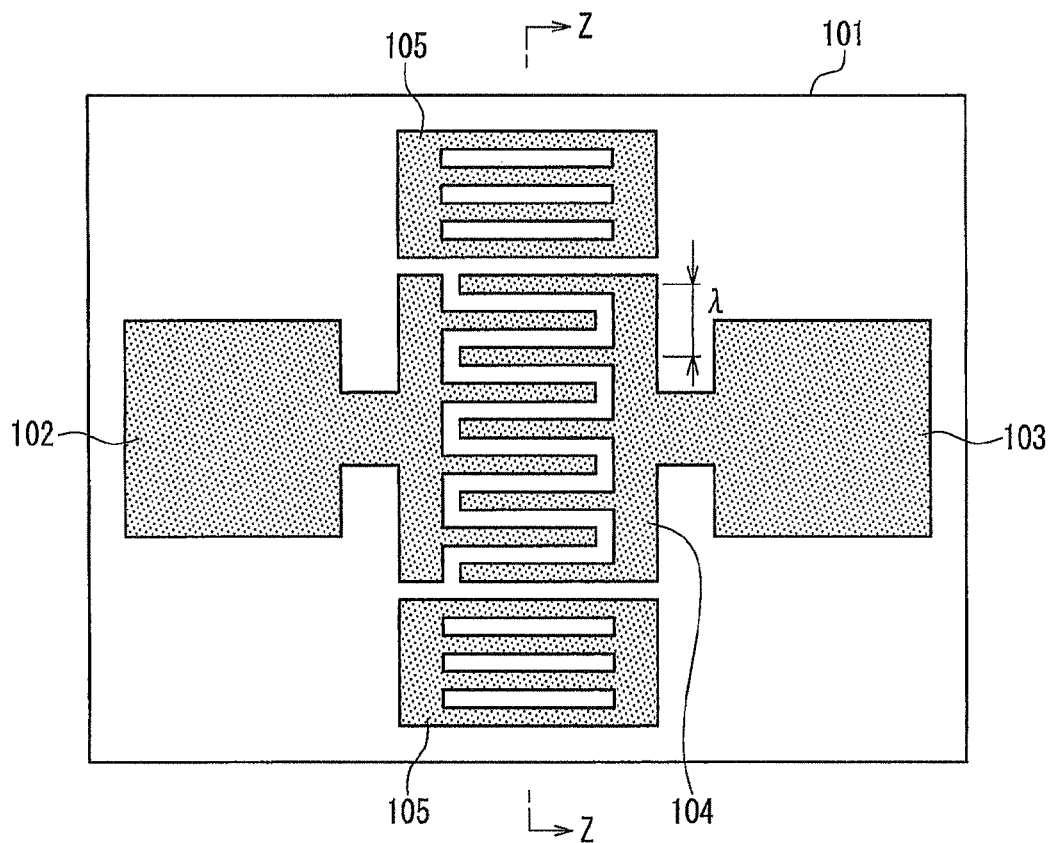
FIG. 2B is a plan view of a surface acoustic wave filter.
Figure 2C:
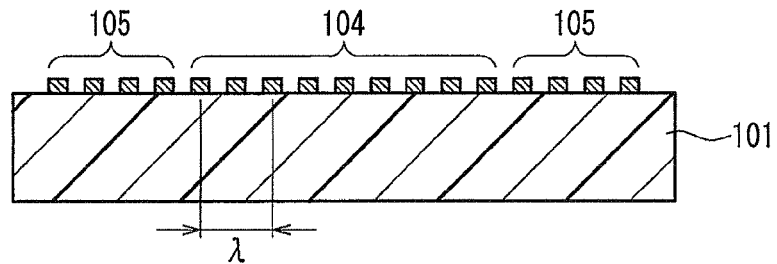
FIG. 2C is a cross-sectional view of a portion Z-Z in FIG. 2B.
Figure 3A:
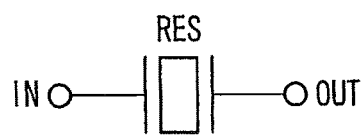
FIG. 3A is a circuit diagram of a filter.
Figure 3B:
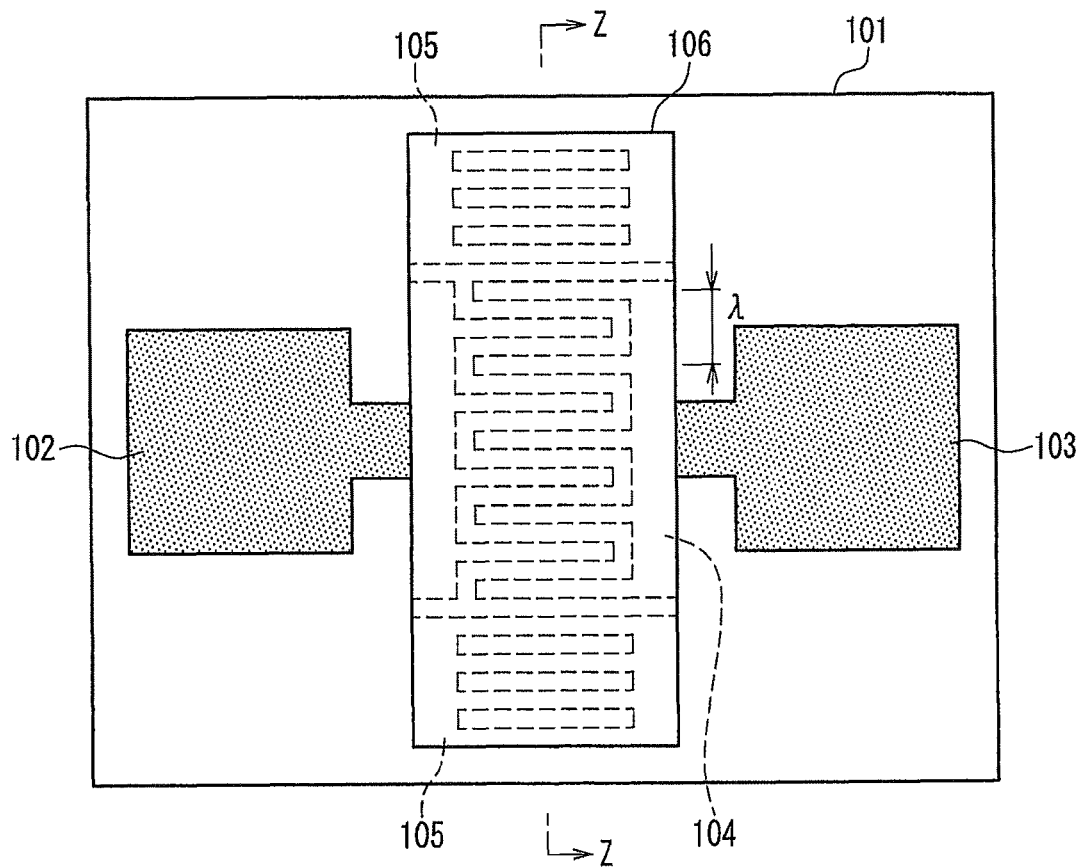
FIG. 3B is a plan view of a Love wave filter
Figure 3C:
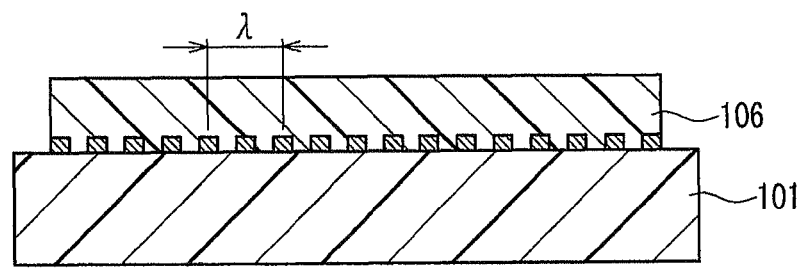
FIG. 3C is a cross-sectional view of a portion Z-Z in FIG. 3B.
Figure 4A:
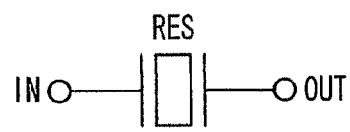
FIG. 4A is a circuit diagram of a filter.
Figure 4B:
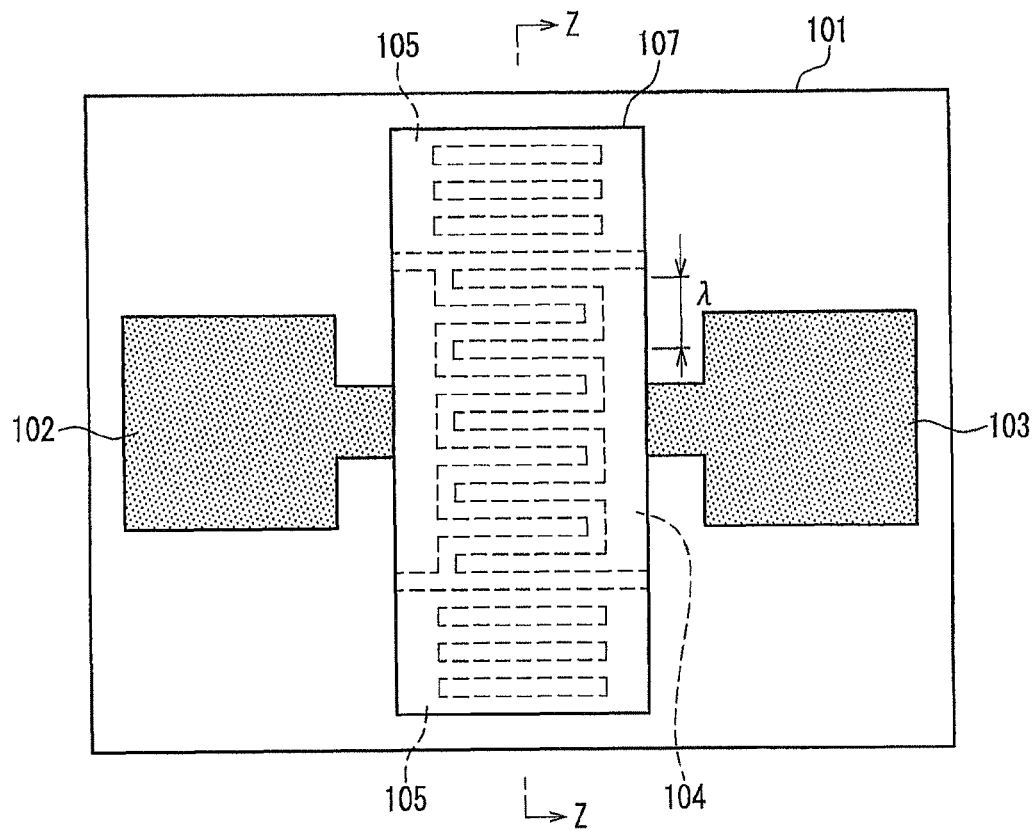
FIG. 4B is a plan view of an elastic boundary wave filter.
Figure 4C:
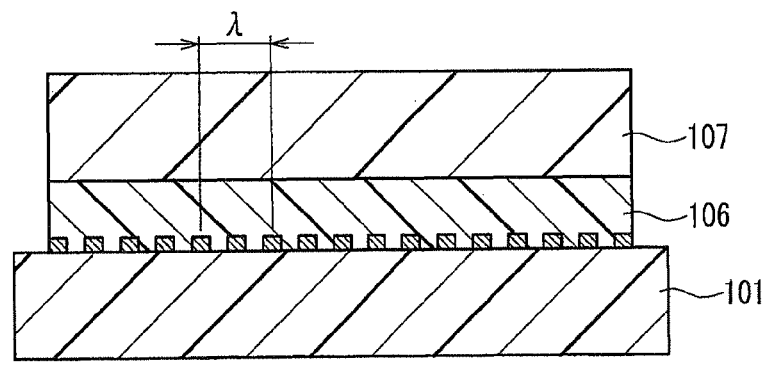
FIG. 4C is a cross-sectional view of a portion Z-Z in FIG. 4B.

FIG. 1 is a circuit diagram of ladder filter. Acoustic wave filters and duplexers are frequently used in mobile phone terminals in order to extract only high frequency signals having a required frequency. In particular, a ladder filter in which acoustic wave resonators RES are connected in a ladder configuration as illustrated in FIG. 1 is often used. Examples of resonators used as the acoustic wave resonators included in the ladder filter are the surface acoustic wave resonators illustrated as FIGS. 2A to 2C, the Love wave resonators illustrated as FIGS. 3A to 3C, the acoustic boundary wave resonators illustrated as FIGS. 4A to 4C, and the like. Note that FIGS. 2A, 3A, and 4A are circuit diagrams of resonators. FIGS. 2B, 3B, and 4B are plan views of resonators. FIG. 2C is a cross-sectional view of a portion Z-Z in FIG. 2B. FIG. 3C is a cross-sectional view of a portion Z-Z in FIG. 3B. FIG. 4C is a cross-sectional view of a portion Z-Z in FIG. 4B.

The structure of the resonators illustrated as FIGS. 2A to 4C is such that a pair of comb-shaped electrodes (IDT:Inter Digital Transfer) 104 and a grating reflector 105 on both sides thereof are provided on a piezoelectric substrate 101 made of lithium tantalate ($LiTaO_3$), lithium niobate ($LiNbO_3$), or the like. The Love wave resonators illustrated as FIGS. 3A to 3C are formed by depositing a first dielectric 106 such as $SiO_2$ on the IDT 104. The elastic boundary wave resonators illustrated as FIGS. 4A to 4C are formed by further depositing a second dielectric 107 such as silicon or alumina on the first dielectric 106. The acoustic wave resonators illustrated as FIGS. 2A to 4C resonate at a frequency determined by the speed V of acoustic waves that propagate on the IDT 104, and the grating pitch λ of the electrodes constituting the IDT 104. Specifically, the resonance frequency FR of the acoustic wave resonators can be roughly calculated using the following expression 1.

$$FR = V/\lambda \quad (1)$$

Accordingly, the resonance frequency FR decreases when the grating pitch λ is increased, and the resonance frequency FR increases when the grating pitch λ is decreased.

Although the ladder filter illustrated as FIG. 1 is an unbalanced input-to-unbalanced output filter, there are cases in which there is a desire for the filter or duplexer in a mobile phone terminal to be an unbalanced input-to-balanced output filter or duplexer. An unbalanced input-to-balanced output filter is generally called a "balance filter".

Figure 5:
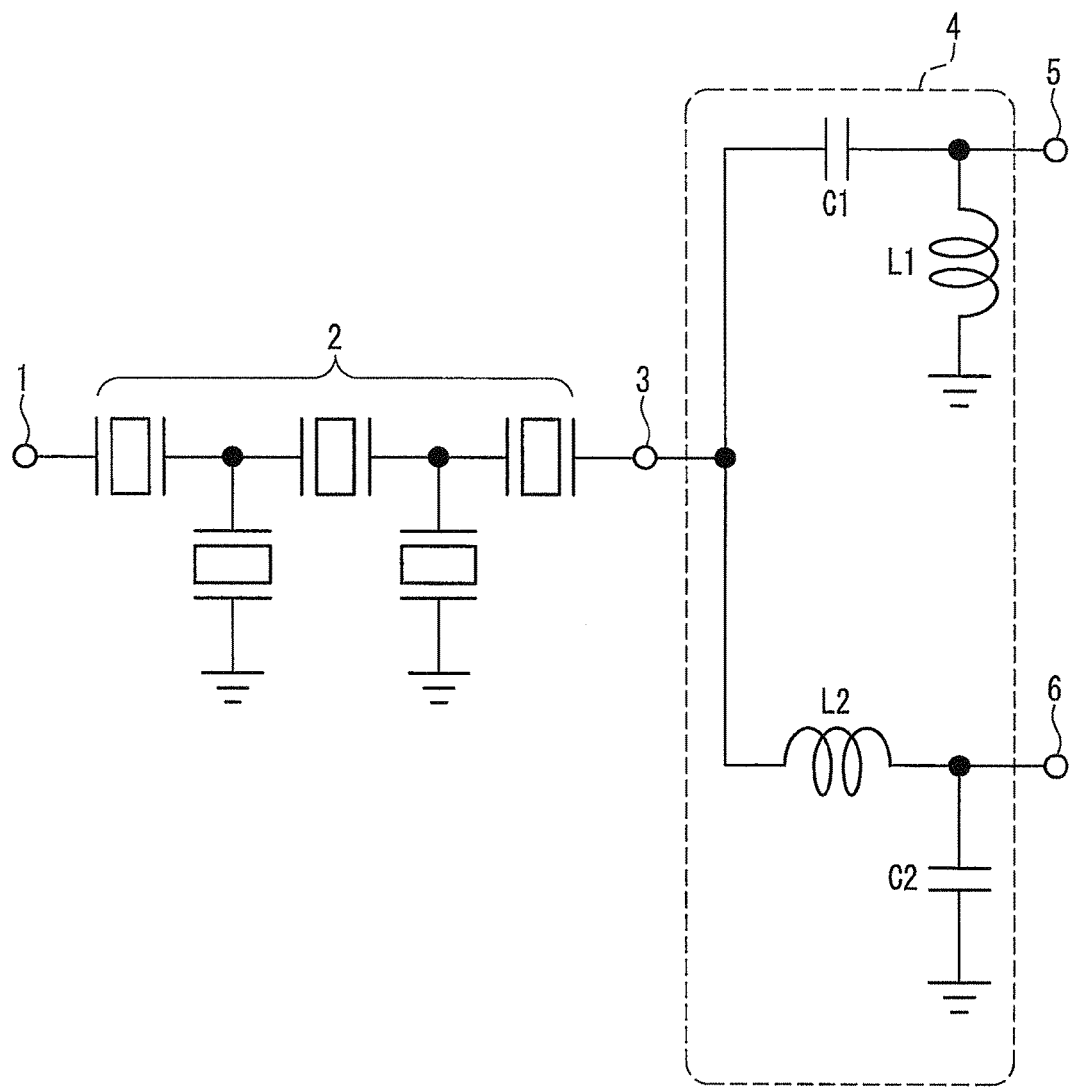
FIG. 5 is a circuit diagram of an unbalanced ladder filter and a lumped constant balun.

FIG. 5 is a circuit diagram of an unbalanced ladder filter and a lumped constant balun. FIGS. 6A to 6D are circuit diagrams of exemplary variations of a lumped constant balun. One method of causing an unbalanced ladder filter to become a balance filter is, as illustrated in FIG. 5, a method of connecting a lumped constant balun 4 to an output terminal 3 of an unbalanced ladder filter 2. The lumped constant balun 4 is a balanced-to-unbalanced converter that includes inductors and capacitors. As illustrated in FIG. 5, the lumped constant balun 4 includes, for example, a capacitor C1, an inductor L1, and an inductor L2. The capacitor C1 is series-connected to one signal line. The inductor L1 is connected between the one signal line and a ground. The inductor L2 is series-connected to another signal line, and a capacitor C2 that is connected between the other signal line and a ground. A first output terminal 5 is connected to the one signal line, and a second output terminal 6 is connected to the other signal line. This enables realizing a balance filter that uses an unbalanced ladder filter.

Figure 6A:
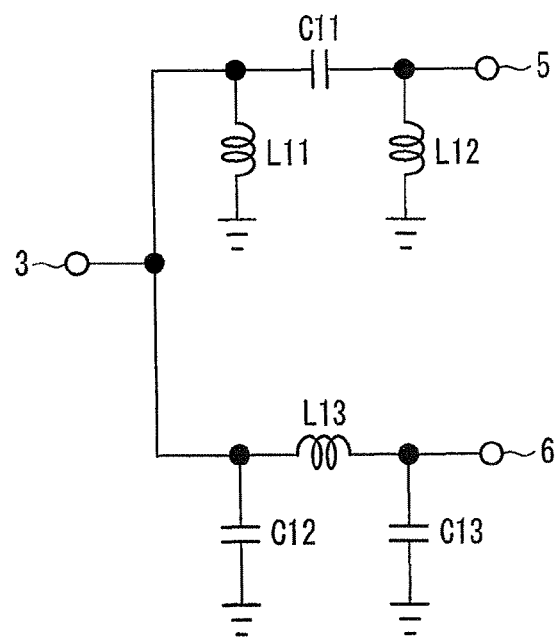
FIGS. 6A to 6D are circuit diagrams of exemplary variations of a lumped constant balun.
Figure 6B:
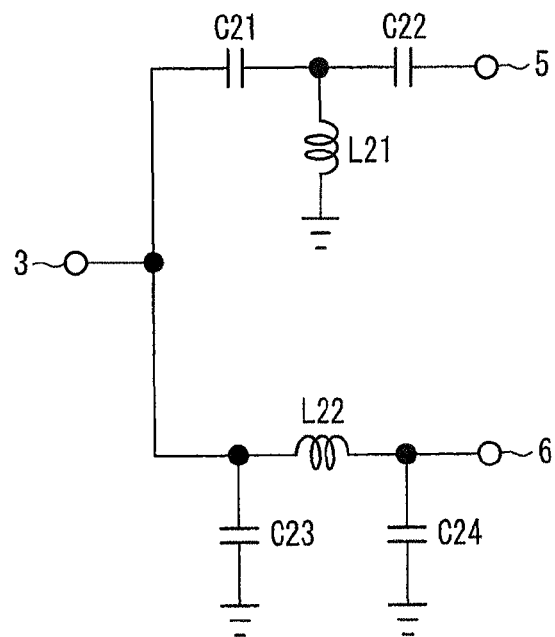
Figure 6C:
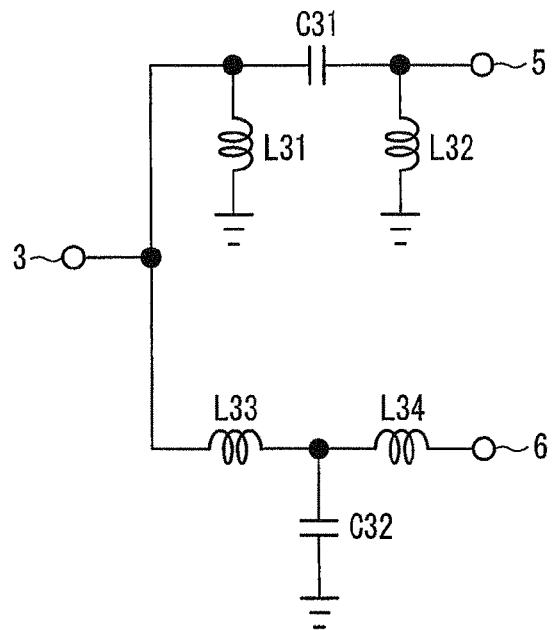
Figure 6D:
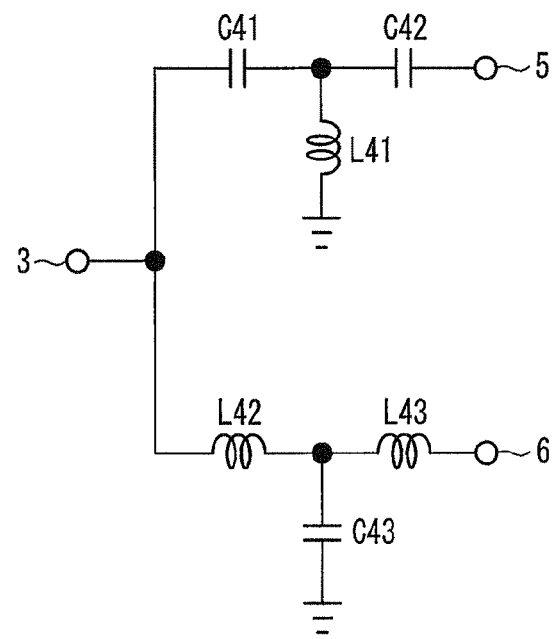

Note that the lumped constant balun 4 is not limited to the configuration illustrated as FIG. 5, but instead can be realized by, for example, the circuits illustrated as FIGS. 6A to 6D. FIG. 6A illustrates a lumped constant balun in which a capacitor C11 and inductors L11 and L12 are connected in the shape of "π" and connected to the first output terminal 5, and an inductor L13 and capacitors C12 and C13 are connected in the shape of "π" and connected to the second output terminal 6. FIG. 6B illustrates a lumped constant balun in which capacitors C21, C22, and an inductor L21 are connected in the shape of a "T" and connected to the first output terminal 5, and an inductor L22 and capacitors C23 and C24 are connected in the shape of "π" and connected to the second output terminal 6. FIG. 6C illustrates a lumped constant balun in which a capacitor C31 and inductors L31 and L32 are connected in the shape of "π" and connected to the first output terminal 5, and inductors L33 and L34 and a capacitor C32 are connected in the shape of a "T" and connected to the second output terminal 6. FIG. 6D illustrates a lumped constant balun in which capacitors C41 and C42 and an inductor L41 are connected in the shape of a "T" and connected to the first output terminal 5, and inductors L42 and L43 and a capacitor C43 are connected in the shape of a "T" and connected to the second output terminal 6.

Figure 7:
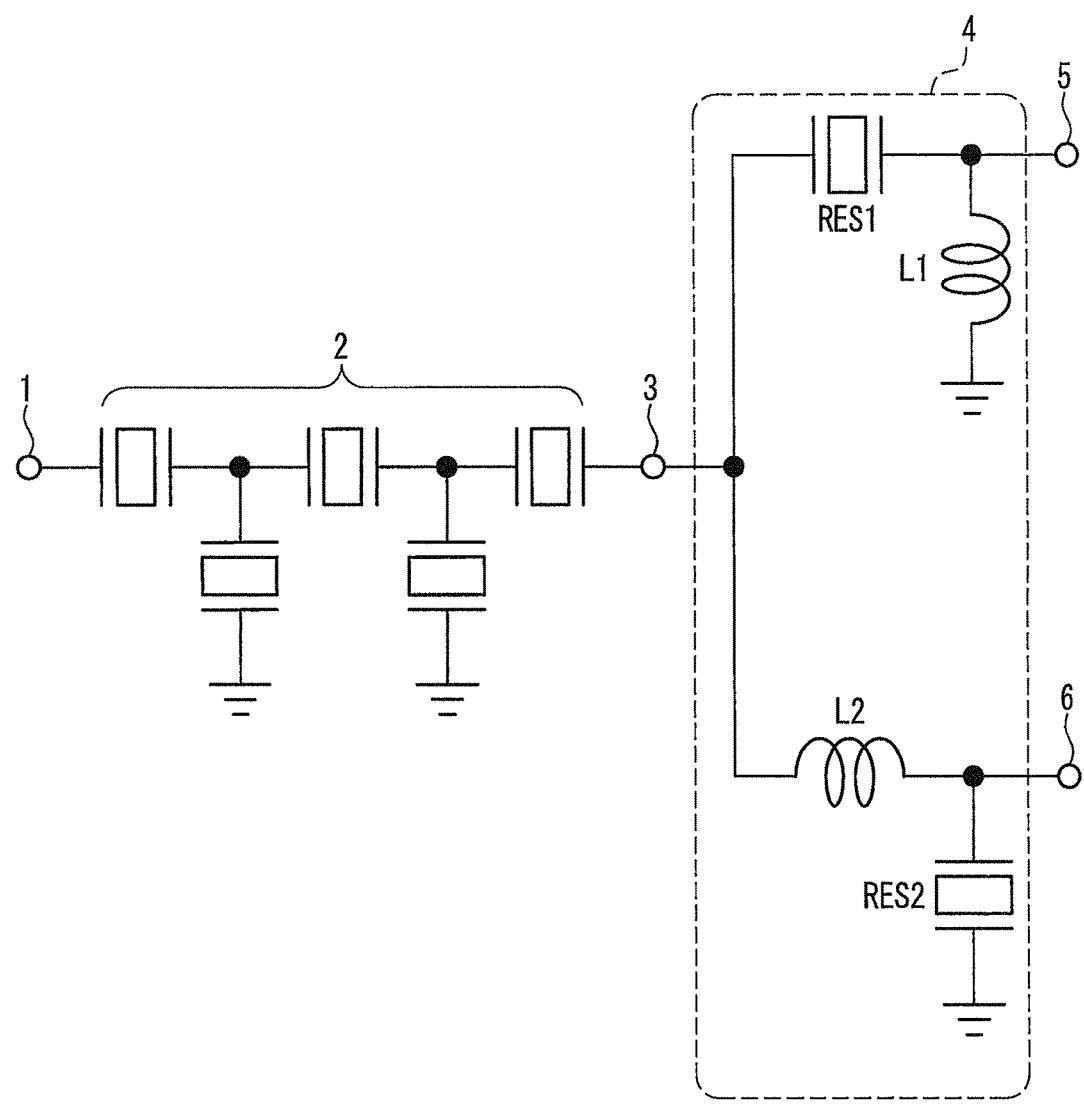
FIG. 7 is a circuit diagram of a ladder filter that includes a lumped constant balun that includes resonators.

FIG. 7 is a circuit diagram of a ladder filter that includes a lumped constant balun that includes resonators. As illustrated in FIG. 7, by realizing the capacitors included in the lumped constant balun 4 with acoustic wave resonators RES1 and RES2, and integrating the acoustic wave resonators RES1 and RES2 on an acoustic wave filter chip. It is possible to cut back the mounting area and number of used parts in the lumped constant balun, and reduction in size and cost. In actuality, unlike resonators used in filters, the acoustic wave resonators RES1 and RES2 used as capacitors can be configured without reflectors, and therefore an acoustic wave resonator used as a capacitor will be called an "IDT capacitor" in the description of the embodiment of the present invention.

The inventors of the present invention performed a detailed examination of the Q value of IDT capacitors in the conventional balance filter illustrated as FIG. 7.

Figure 8A:
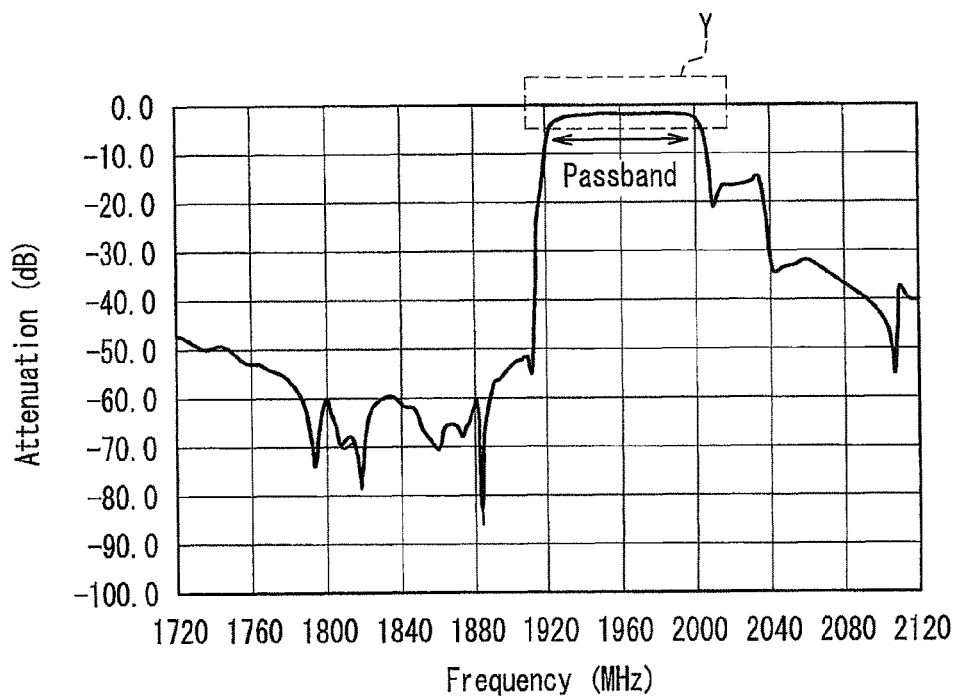
FIG. 8A is a characteristic diagram of the frequency characteristics of the ladder filter illustrated in FIG. 7.
Figure 8B:
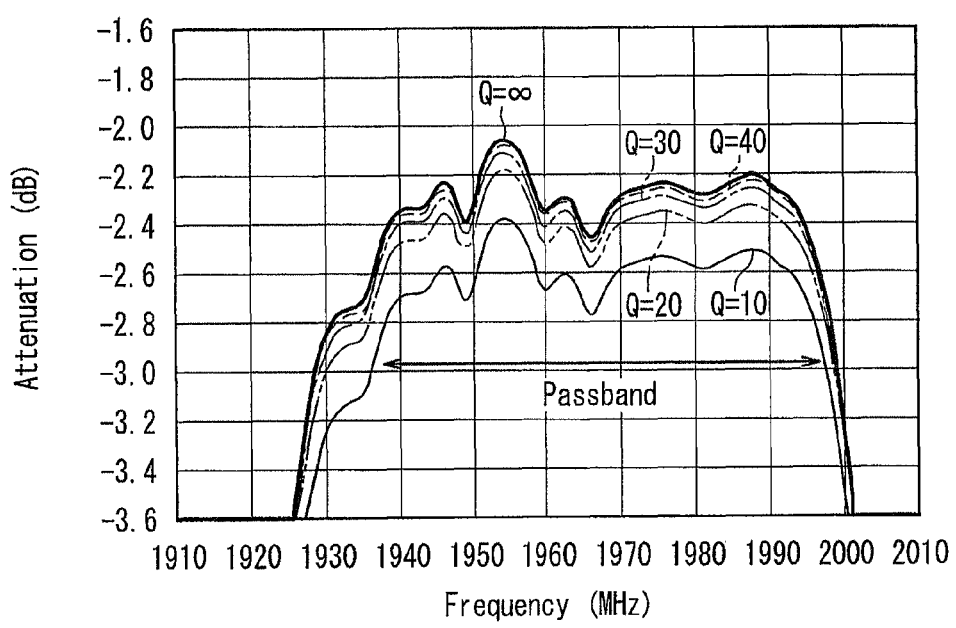
FIG. 8B is an enlarged view of a portion Y in FIG. 8A.

First, the influence that the Q value of the capacitors included in the lumped constant balun has on the filter characteristics was checked through a simulation. FIGS. 8A and 8B illustrates the results of calculating the filter characteristics upon changing only the Q value of the capacitors in the circuit illustrated as FIG. 5. FIG. 8B is an enlarged view of a portion Y in FIG. 8A.

Illustrated as FIGS. 8A and 8B, the Q value of the capacitors was sequentially set to 10, 20, 30, 40, and infinity, and the filter characteristics were measured in each case. Although there was no sign of a large change in the suppression characteristics, a change in loss in the passband was seen. It was found that the loss of the filter decreases as the Q value of the capacitors rises, and the amount of decrease in the loss becomes saturated when the Q value is approximately 40. In other words, it was found that in order to obtain a low-loss balance filter, it is such requirements for the Q value of the capacitors included in the lumped constant balun to be approximately 40, and that raising the Q value any further has little effect.

In light of these calculation results, the capacitor Q value of an actual surface acoustic wave resonator was measured. The surface acoustic wave resonator used in the evaluation was a resonator whose specifications were as follows: IDT grating pitch λ=1.62 μm, aperture length (IDT electrode intersection width)=19.9 λμm, and IDT pair number=59.5 pairs. The resonator was manufactured on a 42-degree Y-cut LiTaO$_3$ substrate.

Figure 9A:
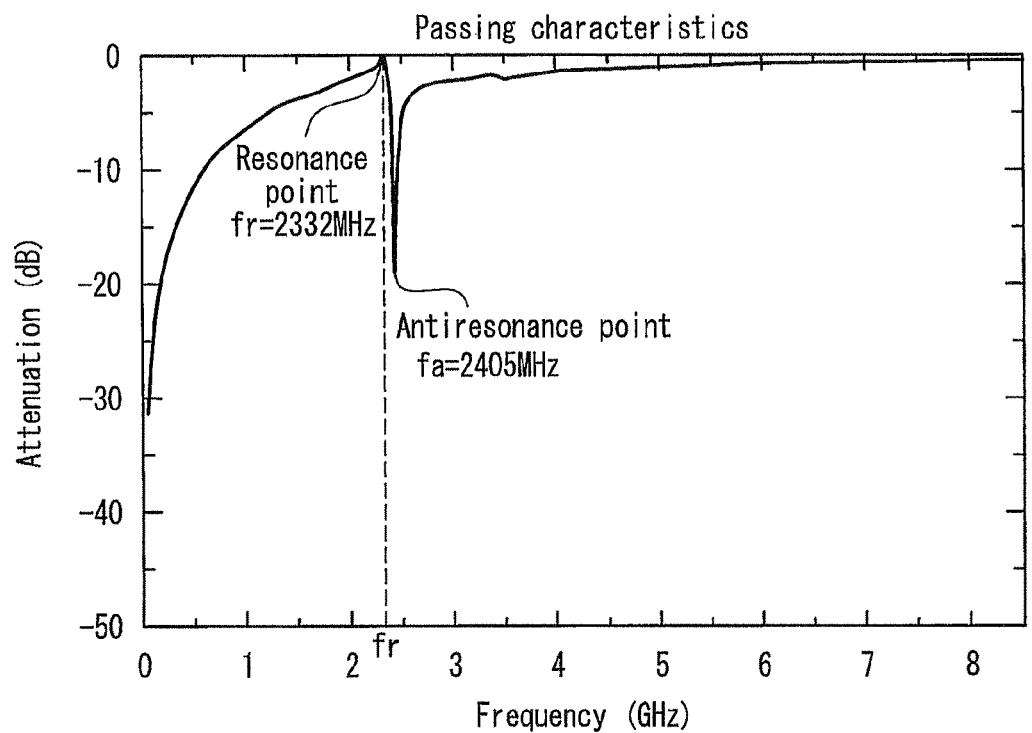
FIG. 9A is a characteristic diagram of the frequency characteristics of a passing characteristic.
Figure 9B:
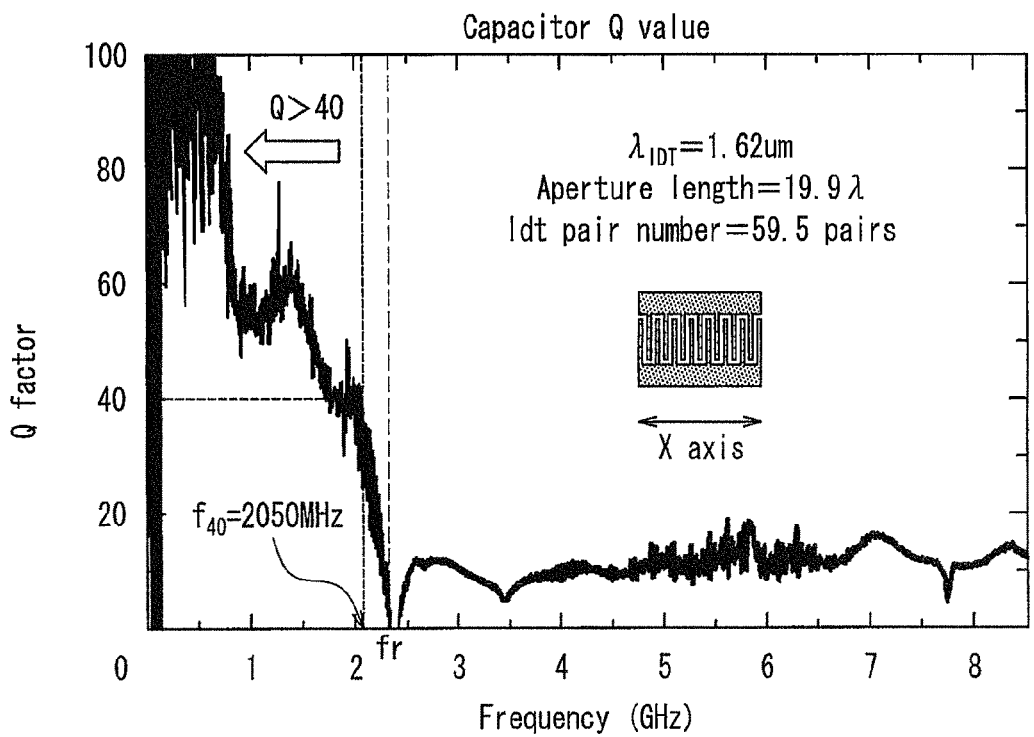
FIG. 9B is a characteristic diagram of the frequency characteristics of a capacitor Q value.

FIG. 9A illustrates passing characteristics measured in the case in which resonators having the above specifications were series-connected. Illustrated as FIG. 9A, the resonance frequency FR of the resonators having the above specifications was 2332 MHz, and the antiresonance frequency FA of these resonators was 2405 MHz. FIG. 9B illustrates the results of measuring the capacitor Q value of the resonators having the above specifications. As illustrated in FIG. 9B, it was found that the Q value was zero in the vicinity of the resonance frequency FR. It was also found that the Q value was very low (approximately 10) at frequencies greater than or equal to the resonance frequency FR. It is thought that at frequencies higher than the resonance frequency FR, bulk waves (acoustic waves radiated in the piezoelectric substrate) are emitted from the IDT, and these waves become loss, thus leading to a reduction in the Q value. Conversely, it was found that at frequencies lower than the resonance frequency FR, the Q value rises as the difference from the resonance frequency FR increases. The frequency $F_{40}$, which is the frequency at which the Q value is 40, is 2050 MHz. It is thought that at frequencies lower than the frequency $F_{40}$, there is little increase in the filter loss even when the resonators having the above specifications are used as the capacitors in the lumped constant balun.

Based on the above results, the relationship between FR and $F_{40}$ can be generalized to the following expression 2.

$$FR = 1.138 \times F_{40} \tag{2}$$

When an actual balance filter is considered, the frequency at which a capacitor Q value of 40 or more is necessary is the filter passband frequency. Letting the upper end frequency of the filter passband be $F_{UP}$, if the resonance frequency FR of the IDT capacitor satisfies the following expression 3, it is possible to ensure an IDT capacitor Q value of 40 or more at frequencies in the filter passband, thus enabling the realization of a low-loss balance filter.

$$FR > 1.138 \times F_{UP} \tag{3}$$

Figure 10:
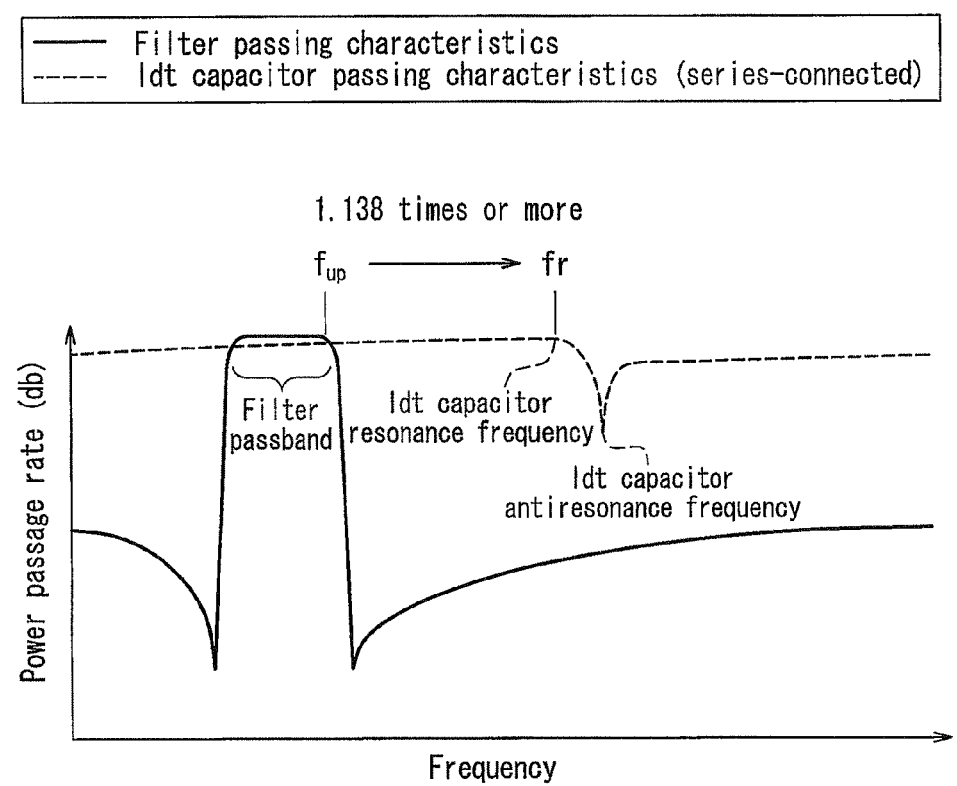
FIG. 10 is a characteristic diagram of the passing characteristics of a filter and the passing characteristics of an IDT capacitor.

FIG. 10 illustrates a diagrammatic illustration of the frequency relationship in expression 3. In FIG. 10, the solid line indicates the passing characteristics of the filter, and the broken line indicates the passing characteristics of the IDT capacitors included in the lumped constant balun in the filter. As illustrated in FIG. 10, by setting the circuit constant such that the upper end frequency $F_{UP}$ of the filter passband and the resonance frequency FR of the IDT capacitors have a difference of 1.138 times or more. It is possible to obtain an IDT capacitor Q value of 40 or more, thus enabling the realization of a low-loss balance filter.

Now expression 3 will be expressed in terms of the grating pitch of the IDT electrodes. In the case of a ladder filter, the resonator that determines the upper end frequency of the filter passband is the series resonator that has the lowest resonance frequency, that is to say, the series resonator that has the widest grating pitch. Letting the IDT grating pitch of the series resonator having the lowest resonance frequency be $\lambda_{IDT}$, and letting the grating pitch of the IDT capacitors be $\lambda_{cap}$, the following expression 4 is obtained based on expressions 1 and 3.

$$\lambda_{IDT} > 1.138 \times \lambda_{cap} \tag{4}$$

Setting the IDT capacitor grating pitch $\lambda_{cap}$ such that the expression 4 is satisfied enables obtaining an IDT capacitor Q value of 40 or more at frequencies in the filter passband, thus enabling the realization of a low-loss balance filter.

Although the above description is based on experimental data for surface acoustic wave resonators that were manufactured on a 42-degree Y-cut $LiTaO_3$ substrate and whose specifications were a grating pitch $\lambda$ of 1.62 μm, an aperture length (IDT electrode intersection width) of 19.9 $\lambda$μm, and an IDT pair number of 59.5 pairs, the inventors of the present invention performed similar experiments for other resonators as well. The cut angle of the $LiTaO_3$ substrate was varied between 36-degrees and 48-degree Y, but there was no change in the relationship of expression 2. Even when the grating pitch, aperture length, and IDT pair number of the resonators was varied, there was no change in the relationship of expression 2.

[2. Exemplary Variations of a Balance Filter]

The IDT capacitor according to the present embodiment not only can be applied to the balance filter illustrated as FIG. 7, but also can be applied to various types of balance filters.

Figure 11:
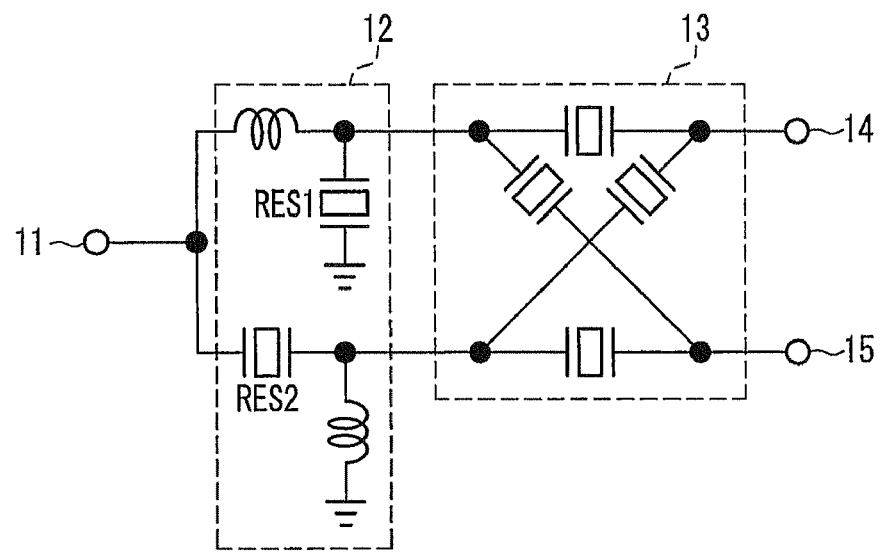
FIG. 11 is a circuit diagram of a lumped constant balun and a lattice filter.

FIG. 11 illustrates a balance filter in which a lattice filter 13 is connected to the balanced output side of a lumped constant balun 12. The lattice filter 13 includes a first signal line connected to a first balanced output terminal of the lumped constant balun 12 and a first output terminal 14, and a second signal line connected to a second balanced output terminal of the lumped constant balun 12 and a second output terminal 15. The lattice filter 13 also includes a series resonator connected to the first signal line, and a series resonator connected to the second signal line. The lattice filter 13 also includes a parallel resonator connected between the first balanced output terminal of the lumped constant balun 12 and the second output terminal 15, and a parallel resonator connected between the second balanced output terminal of the lumped constant balun 12 and the first output terminal 14. In the balance filter illustrated in FIG. 11, by including the IDT capacitors RES1 and RES2 of the present embodiment in the lumped constant balun 12, it is possible to realize a low-loss balance filter.

Figure 12:
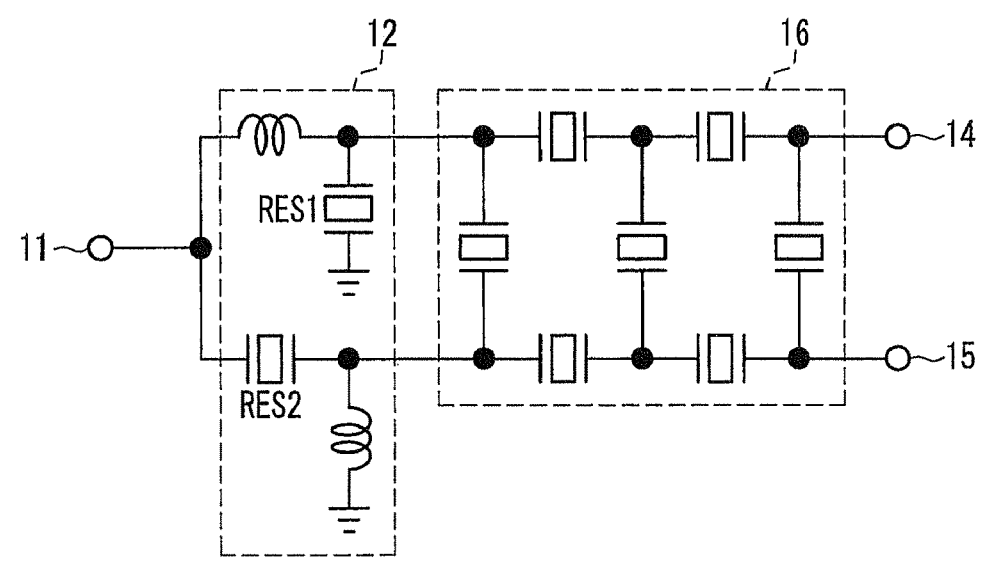
FIG. 12 is a circuit diagram of a lumped constant balun and a ladder filter.

FIG. 12 illustrates a balance filter in which a balanced ladder filter 16 is connected to the balanced output side of the lumped constant balun 12. The balanced ladder filter 16 includes a plurality of series resonators that are series-connected to the first signal line between the first balanced output terminal of the lumped constant balun 12 and the first output terminal 14. The balanced ladder filter 16 includes a plurality of series resonators that are series-connected to the second signal line between the second balanced output terminal of the lumped constant balun 12 and the second output terminal 15. The balanced ladder filter 16 includes a plurality of parallel resonators that are parallel connected between the first signal line and the second signal line. In the balance filter illustrated as FIG. 12, by including the IDT capacitors RES1 and RES2 of the present embodiment in the lumped constant balun 12, it is possible to realize a low-loss balance filter.

Figure 13:
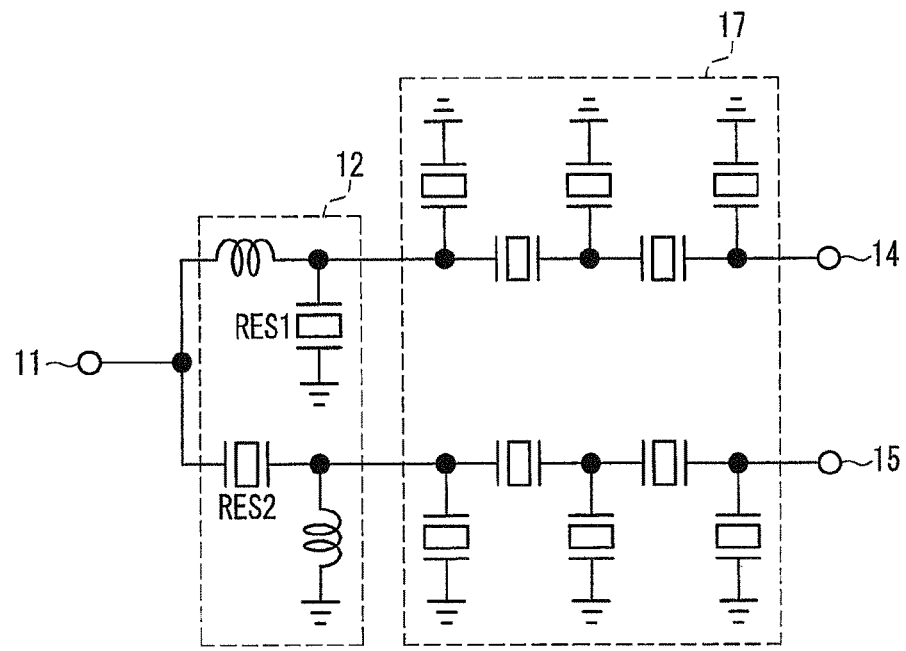
FIG. 13 is a circuit diagram of a lumped constant balun and an unbalanced ladder filter.

FIG. 13 illustrates a balance filter in which an unbalanced ladder filter 17 is connected to the balanced output side of the lumped constant balun 12. The unbalanced ladder filter 17 includes a plurality of series resonators that are series-connected to the first signal line between the first balanced output terminal of the lumped constant balun 12 and the first output terminal 14. The unbalanced ladder filter 17 includes a plurality of series resonators that are series-connected to the second signal line between the second balanced output terminal of the lumped constant balun 12 and the second output terminal 15. The unbalanced ladder filter 17 includes a plurality of parallel resonators that are parallel connected between the first signal line and a ground. The unbalanced ladder filter 17 includes a plurality of parallel resonators that are connected between the second signal line and a ground. In the balance filter illustrated as FIG. 13, by including the IDT capacitors RES1 and RES2 of the present embodiment in the lumped constant balun 12, it is possible to realize a low-loss balance filter.

Figure 14:
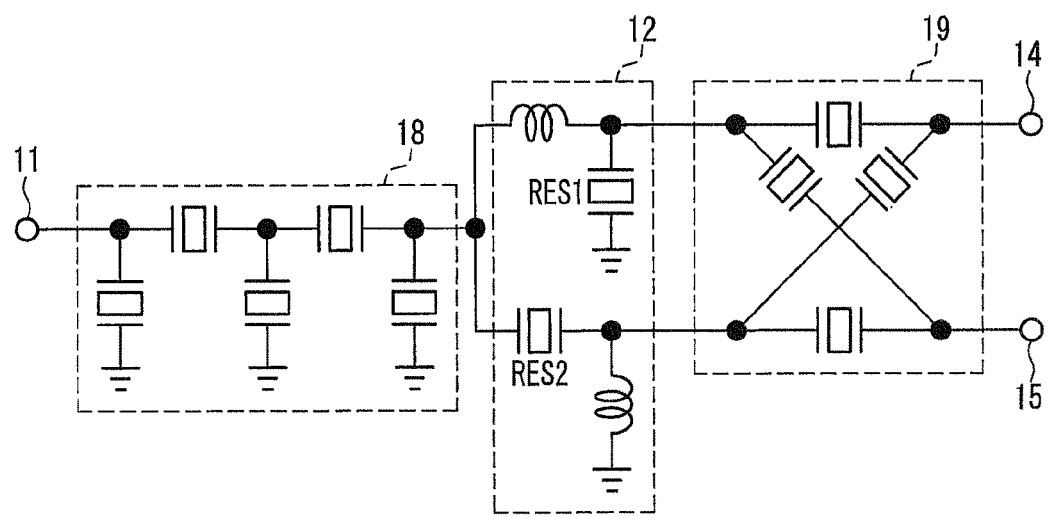
FIG. 14 is a circuit diagram of an unbalanced ladder filter, a lumped constant balun, and a lattice filter.

FIG. 14 illustrates a balance filter in which an unbalanced ladder filter 18 is connected to the unbalanced input side of the lumped constant balun 12, and a lattice filter 19 is connected to the balanced output side of the lumped constant balun 12. The unbalanced ladder filter 18 includes a plurality of series resonators that are series-connected to a signal line between an input terminal 11 and a first unbalanced input terminal of the lumped constant balun 12, and a parallel resonator that is parallel connected between a signal line and a ground. The lattice filter 19 includes a series resonator that is series-connected to the first signal line between the first balanced output terminal of the lumped constant balun 12 and the first output terminal 14. The lattice filter 19 includes a series resonators that is series-connected to the second signal line between the second balanced output terminal of the lumped constant balun 12 and the second output terminal 15. The lattice filter 19 includes a parallel resonator that is connected between the first balanced output terminal of the lumped constant balun 12 and the second output terminal 15. The lattice filter 19 includes a parallel resonator that is connected between the second balanced output terminal of the lumped constant balun 12 and the first output terminal 14. In the balance filter illustrated as FIG. 14, by including the IDT capacitors RES1 and RES2 of the present embodiment in the lumped constant balun 12, it is possible to realize a low-loss balance filter.

[3. Duplexer Configuration]

Figure 15:
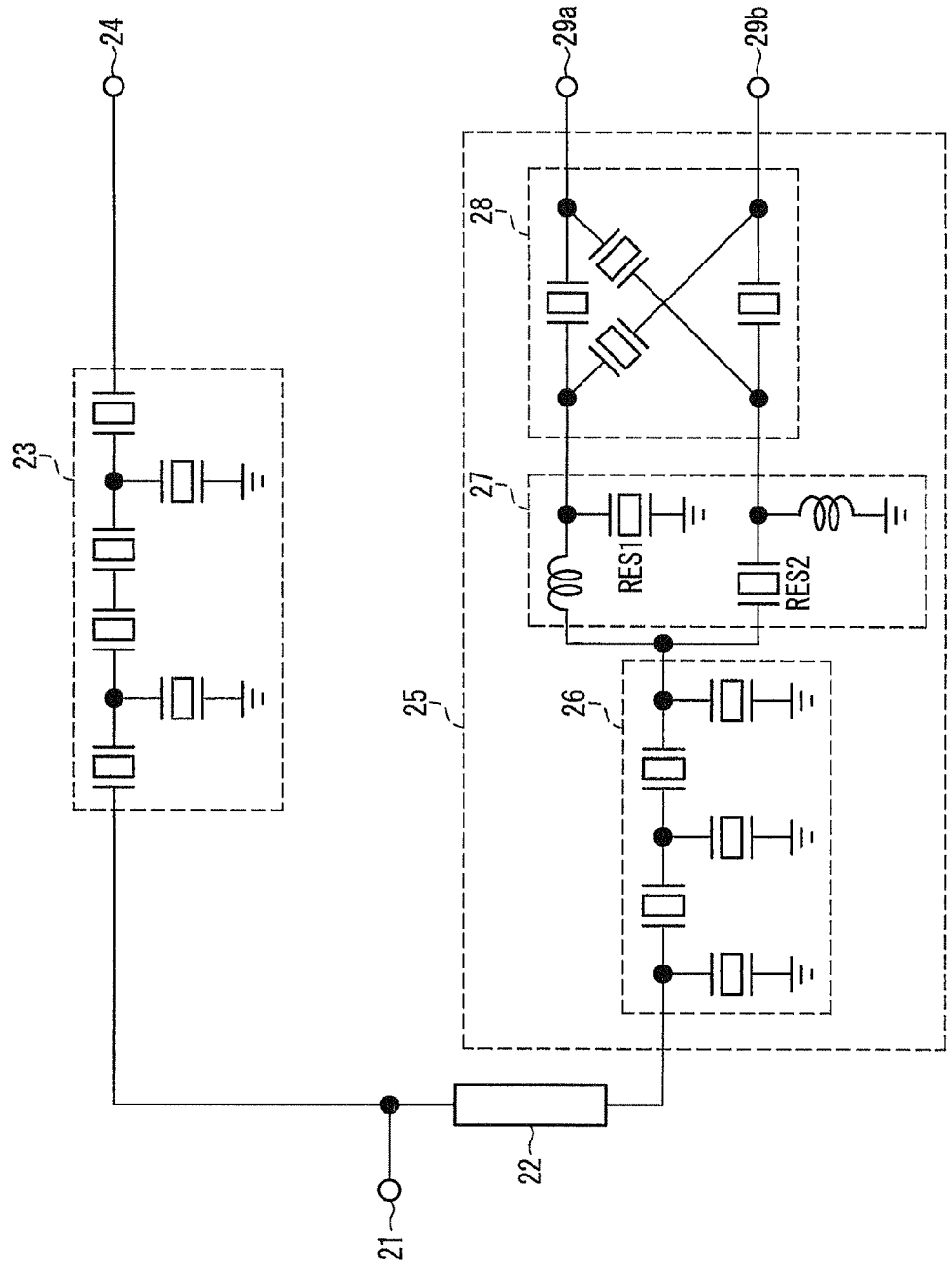
FIG. 15 is a circuit diagram of a duplexer.

FIG. 15 is a circuit diagram of a balance duplexer that includes the balance filter illustrated as FIG. 14. The balance duplexer illustrated as FIG. 15 includes an antenna terminal 21, a matching circuit 22, a transmission filter 23, an input terminal 24, a reception filter 25, a first output terminal 29a, and a second output terminal 29b. The transmission filter 23 is realized by a ladder filter in which a plurality of resonators is connected in a ladder configuration. The reception filter 25 includes a ladder filter 26, a lumped constant balun 27, and a lattice filter 28. The lumped constant balun 27 is a circuit that converts unbalanced input to balanced output as previously described. The lumped constant balun 27 includes inductors and the IDT capacitors RES1 and RES2.

Figure 16A:
FIGS. 16A to 16D are circuit diagrams of matching circuits.
Figure 16B:
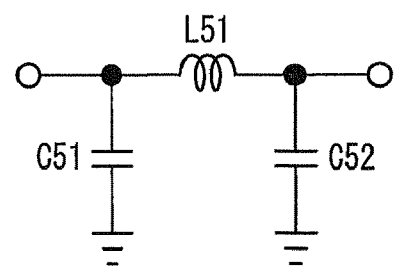
Figure 16C:
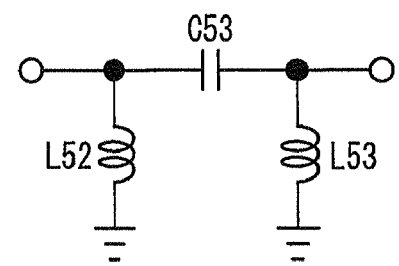
Figure 16D:
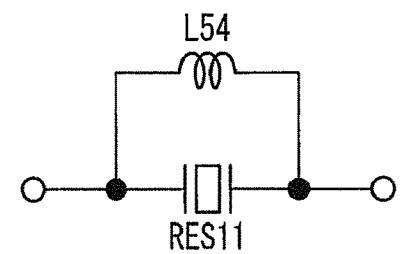

The matching circuit 22 is a circuit that matches the phase of a signal output from the transmission filter 23 and a signal input to the reception filter 25. The matching circuit 22 can be realized by any of the circuits illustrated as FIGS. 16A to 16D. FIG. 16A illustrates a matching circuit realized by a stripline or a micro stripline. FIG. 16B illustrates a matching circuit in which an inductor L51 and capacitors C51 and C52 are connected in the shape of "π". FIG. 16C illustrates a matching circuit in which a capacitor C53 and inductors L52 and L53 are connected in the shape of "π". FIG. 16D illustrates a matching circuit realized by a resonator RES11 to which a parallel inductor L54 has been added.

Figure 17:
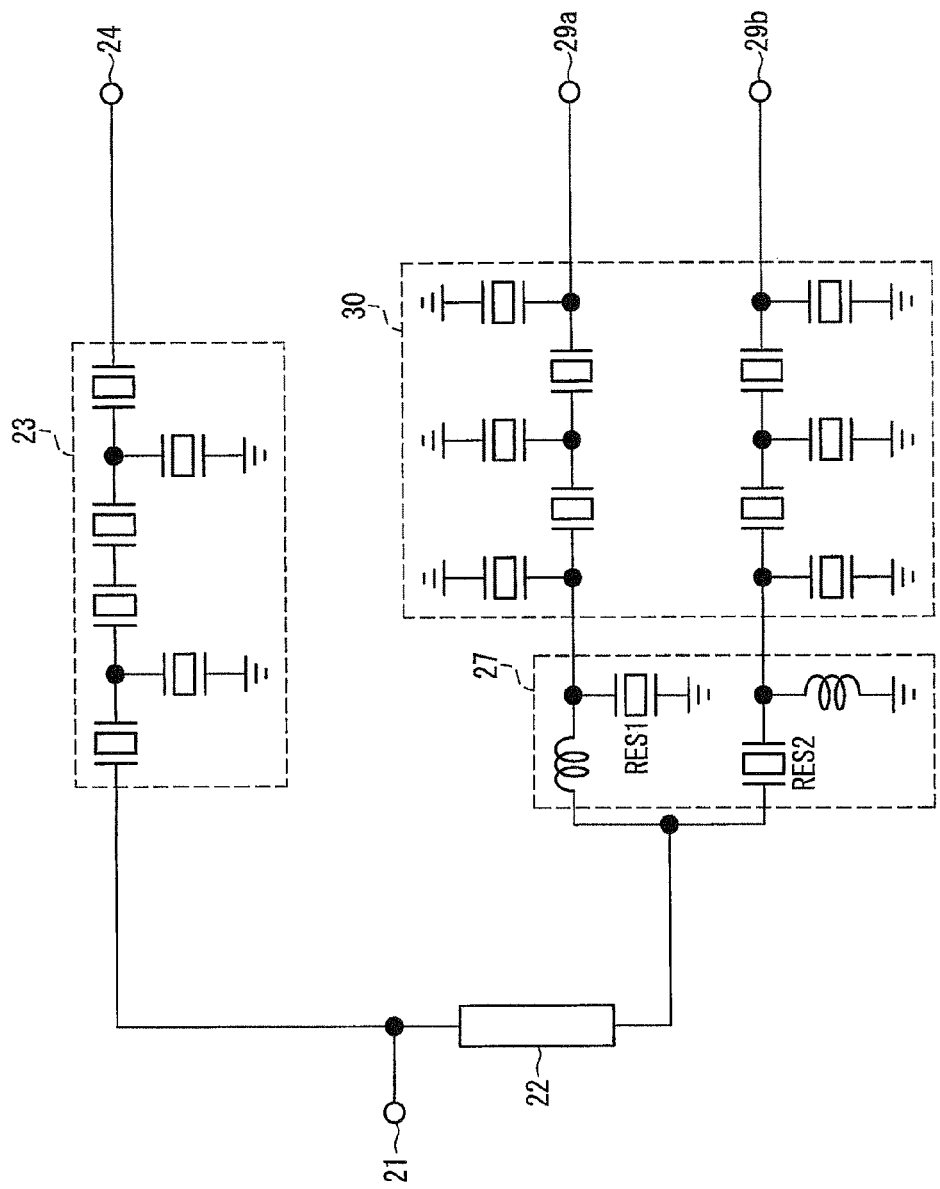
FIG. 17 is a circuit diagram of a duplexer.

FIG. 17 is a circuit diagram of a balance duplexer that includes the balance filter illustrated as FIG. 13. In FIG. 17, the same reference characters have been assigned to constituent elements that are the same as in the balance duplexer illustrated as FIG. 15, and detailed descriptions thereof have been omitted. The configuration illustrated as FIG. 17 differs from the configuration illustrated as FIG. 15 with respect to the configuration of the reception filter and the omission of the matching circuit. A reception filter 30 illustrated as FIG. 17 includes an unbalanced ladder filter. In addition, the duplexer illustrated as FIG. 17 does not include a matching circuit between the antenna terminal 21 and the reception filter 30. Instead, the lumped constant balun 27 plays the role of the matching circuit.

Also, the IDT capacitors of the present embodiment are not limited to being capacitors in a lumped constant balun included in a balance filter, but instead can be used as capacitors for various applications. For example, as illustrated in FIG. 18, an IDT capacitor 45 can be connected in parallel with respect to an acoustic wave resonator 44.

Figure 18:
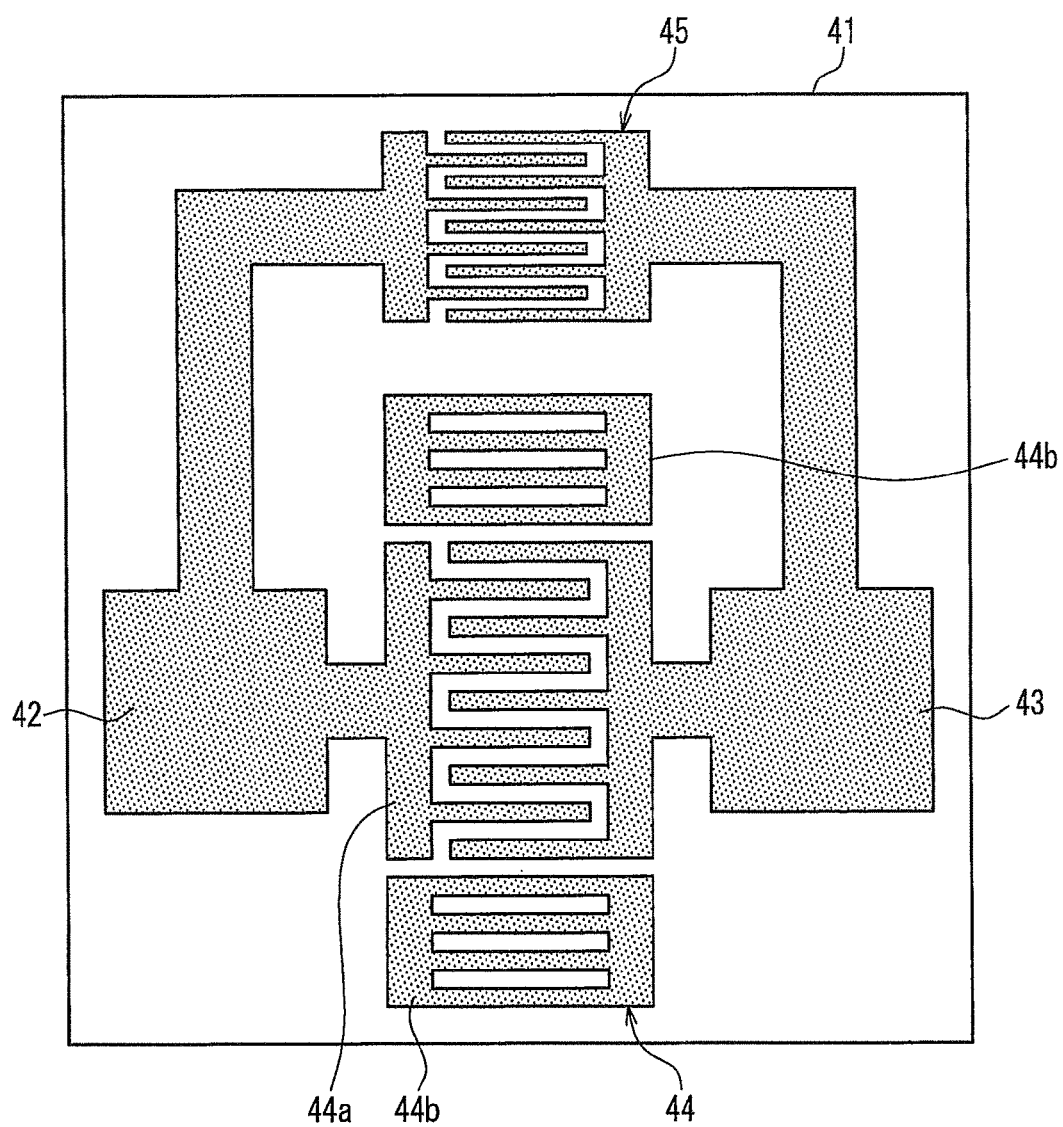
FIG. 18 is a plan view of a resonator that includes an IDT capacitor.

FIG. 18 is a plan view of an acoustic wave resonator and an IDT capacitor. As illustrated in FIG. 18, the acoustic wave resonator 44 includes a pair of comb-shaped electrodes 44a and grating reflectors 44b. One of the comb-shaped electrodes of the acoustic wave resonator 44 is connected to an input terminal 42, and the other comb-shaped electrode is connected to an output terminal 43. In addition, the IDT capacitor 45 is connected to the input terminal 42 and the output terminal 43. The IDT capacitor 45 is realized by a pair of comb-shaped electrodes. In general, by connecting a capacitor in parallel with respect to an acoustic wave resonator, it is possible to reduce the electromechanical coupling coefficient of the acoustic wave resonator. As illustrated in FIG. 18, by using the IDT capacitor 45 of the present embodiment as the capacitor that is parallel connected to the acoustic wave resonator 44, it is possible to reduce the electromechanical coupling coefficient without increasing the loss.

[4. Filter Chip Structure]
(First Working Example)

The following describes a working example of the balance filter of the present embodiment illustrated as FIG. 14.

Figure 19:
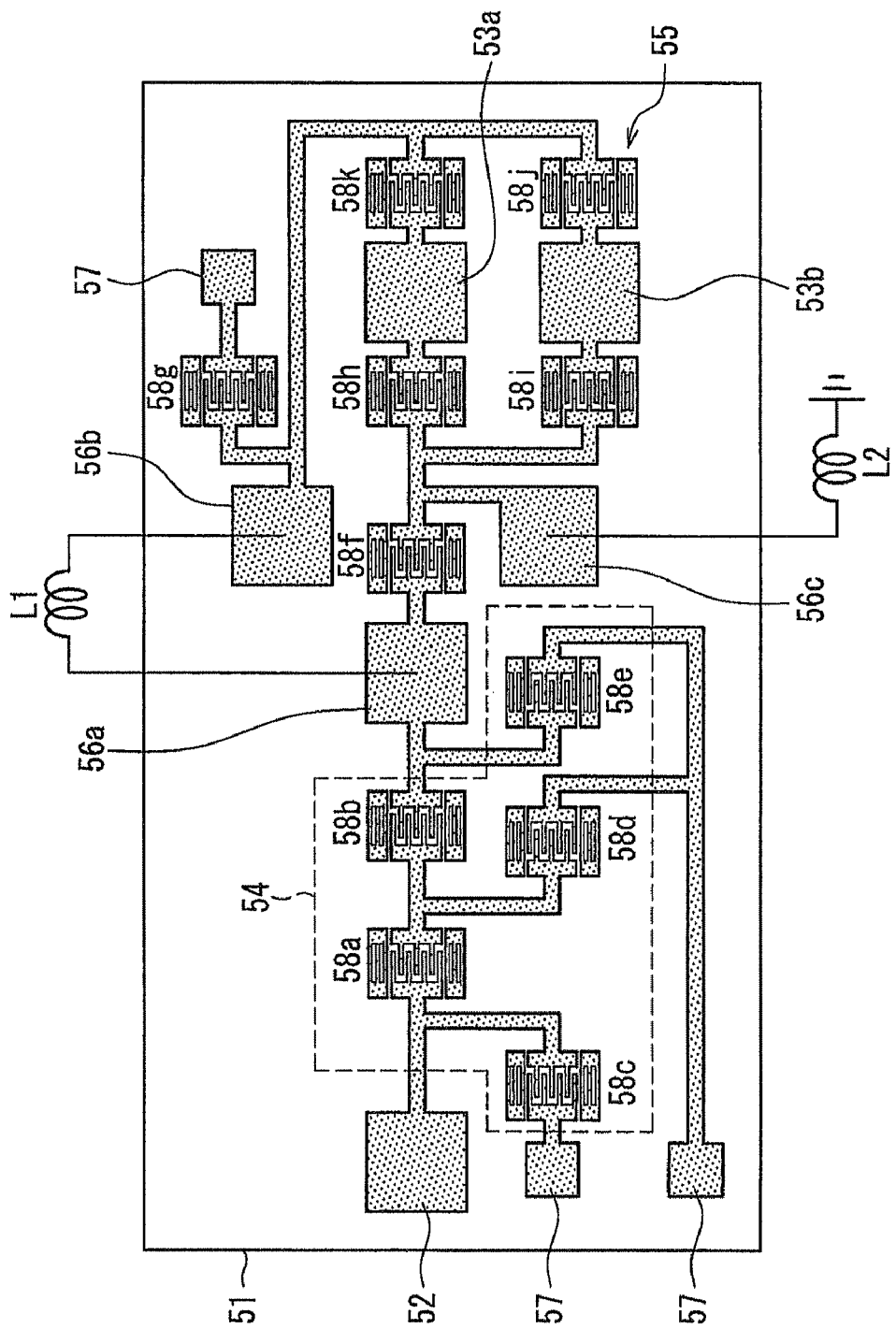
FIG. 19 is a schematic diagram of a chip layout of a balance filter.

FIG. 19 is a layout diagram of a filter chip of the balance filter illustrated as FIG. 14. As illustrated in FIG. 19, the filter chip includes an input terminal 52, output terminals 53a and 53b, a ladder filter 54, a lattice filter 55, and a ground terminal 57 formed on a one-chip piezoelectric substrate 51. The ladder filter 54 includes series resonators 58a and 58b and parallel resonators 58c, 58d, and 58e. The lattice filter 55 includes a series resonator 58h, a series resonator 58i, a parallel resonator 58k, and a parallel resonator 58j. A lumped constant balun includes a series inductor L1, a parallel inductor L2, and resonators 58f and 58g. The resonators 58f and 58g of the lumped constant balun function as capacitors and can be realized by the IDT capacitors of the present embodiment. Here, the grating pitch $\lambda_{cap}$ of the IDT capacitors (resonators 58f and 58g) in FIG. 19 is set such that expression 4 is satisfied. The two inductors L1 and L2 of the lumped constant balun connect to the outside of the filter chip.

Figure 20:
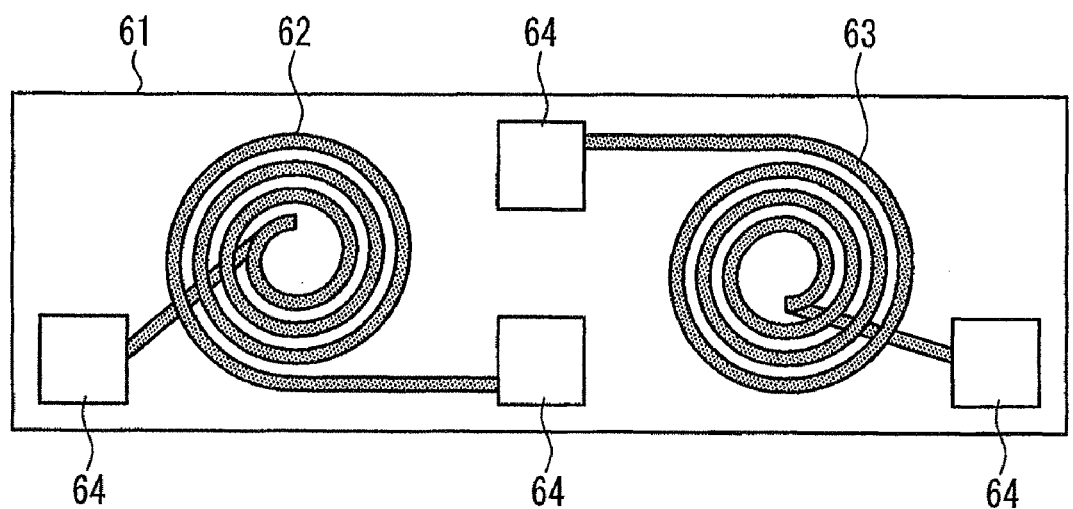
FIG. 20 is a schematic diagram of an inductor chip.

FIG. 20 is a schematic diagram of the structure of an IPD (Integrated Passive Device) inductor chip that includes the two inductors L1 and L2 of the lumped constant balun illustrated as FIG. 19. As illustrated in FIG. 20, the inductors L1 and L2 each include a first spiral coil 62, a second spiral coil 63, and pads 64 on a quartz substrate 61. The first spiral coil 62 corresponds to the inductor L1 in FIG. 19. The second spiral coil 63 corresponds to the inductor L2 in FIG. 19.

Figure 21:
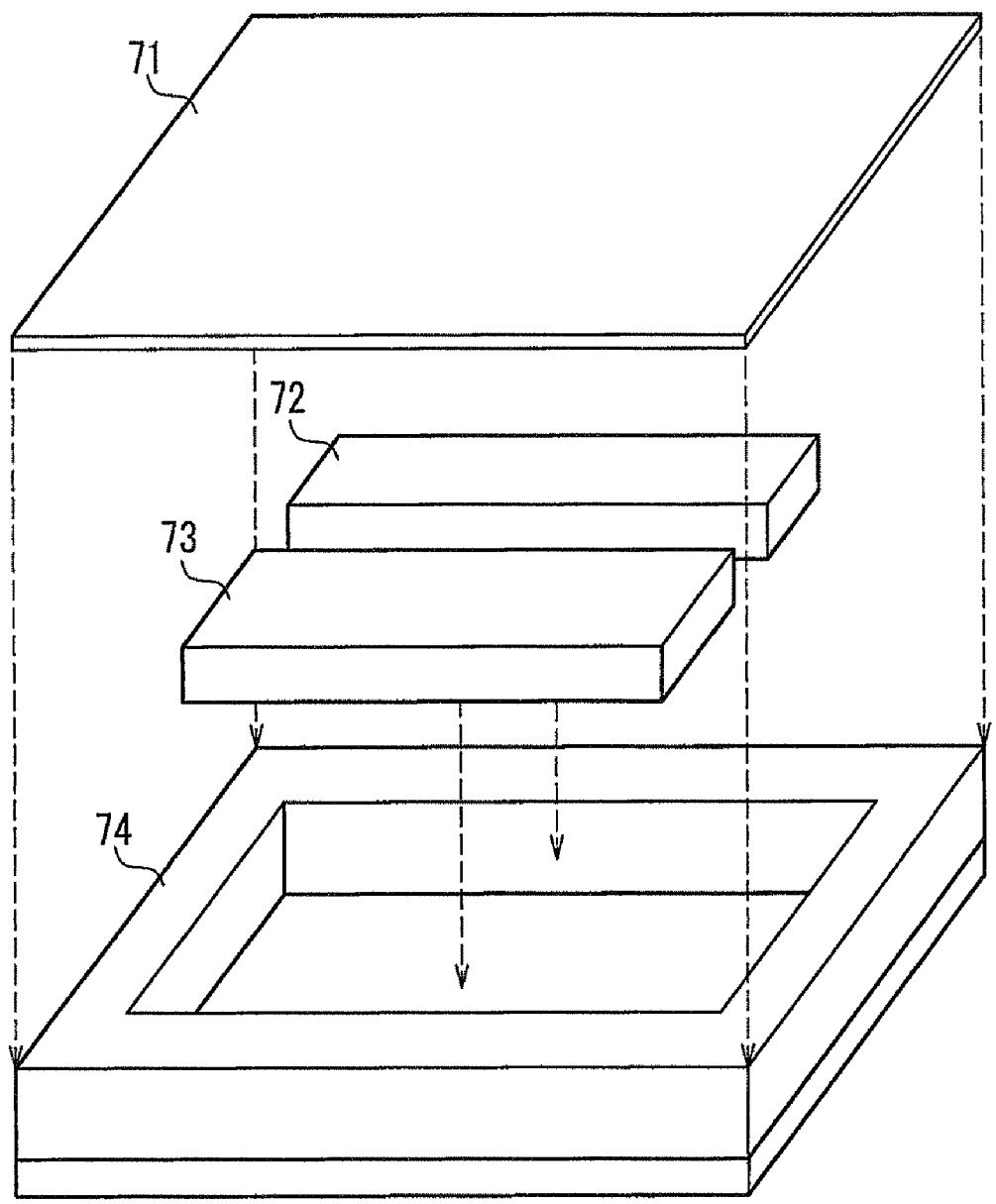
FIG. 21 is a perspective view of a balance filter chip.

FIG. 21 illustrates the package structure of a balance duplexer that includes the filter chip of the first working example. As illustrated in FIG. 21, the balance duplexer is realized by flip-chip mounting a filter chip 73 illustrated in FIG. 19 and an IPD inductor chip 72 illustrated as FIG. 20 in a cavity-type ceramic package 74, and then performing hermitic sealing with use of a metal lid 71. The use of this structure improves the capacitor Q value of the lumped constant balun, thus enabling the realization of a balance filter that is superior in terms of low-loss.

(Second Working Example)

Figure 22:
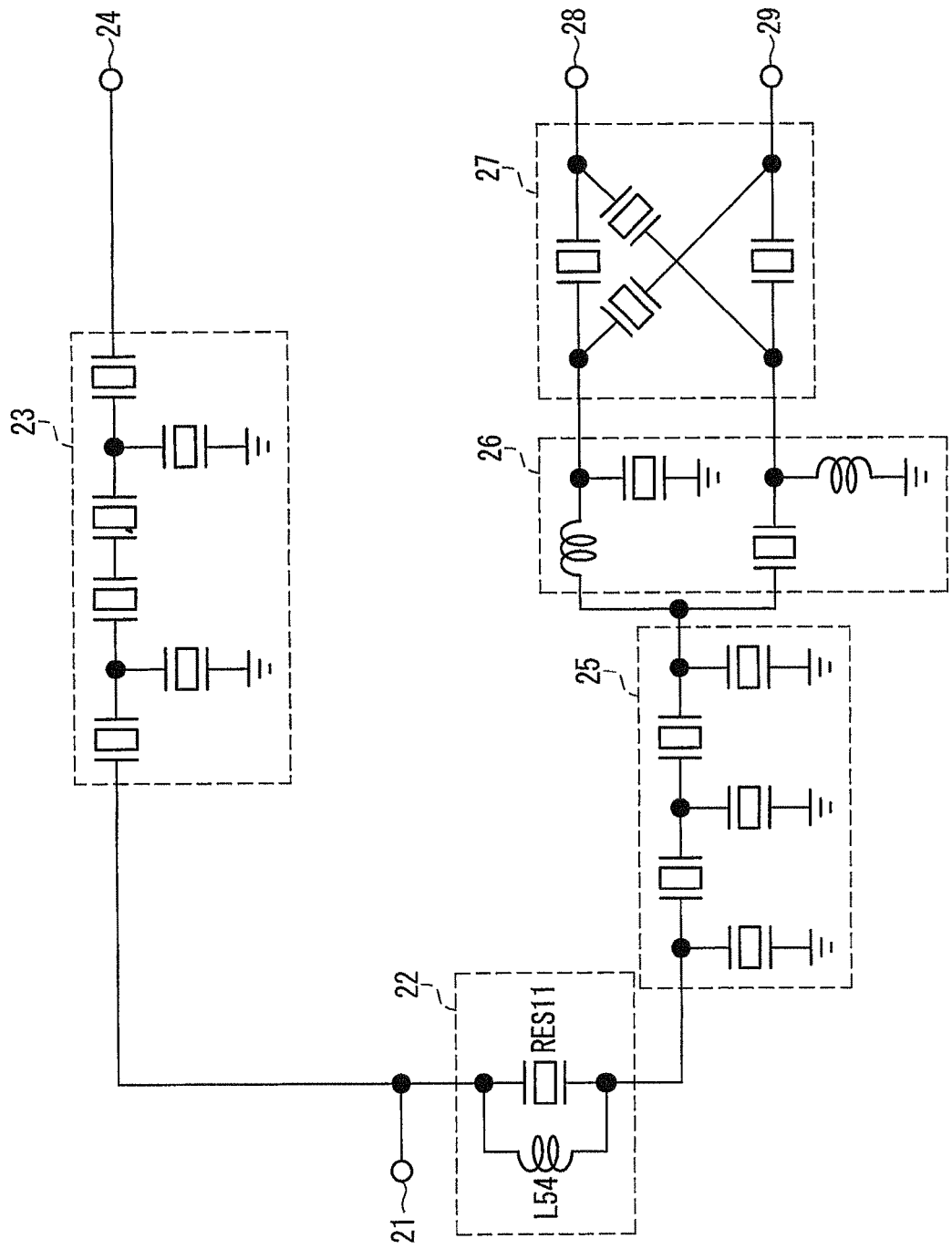
FIG. 22 is a circuit diagram of a duplexer.

FIG. 22 is a circuit diagram of a balance duplexer in a second working example. The balance duplexer illustrated as FIG. 22 is mainly realized by the balance duplexer illustrated as FIG. 15, and the matching circuit in FIG. 15 is realized by the circuit illustrated as FIG. 16C.

Figure 23A:
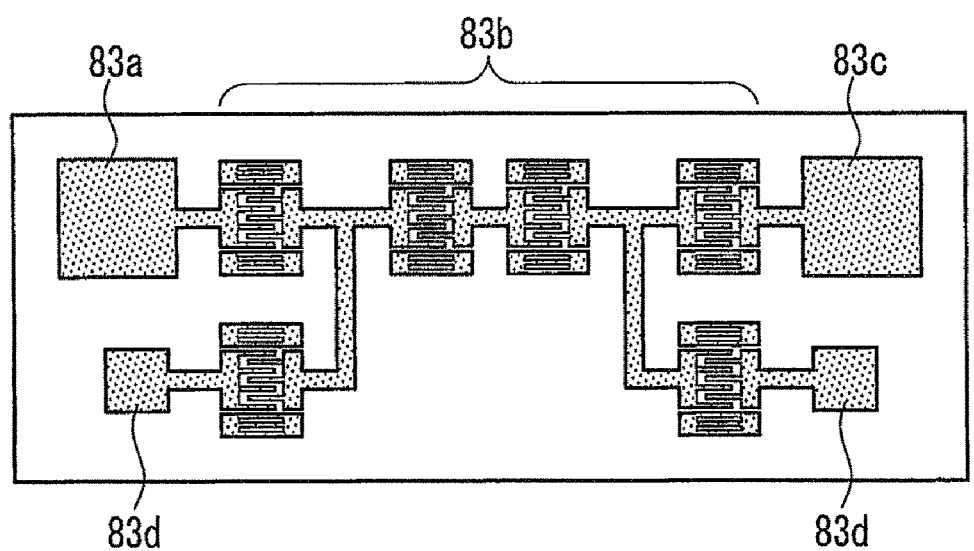
FIG. 23A is a schematic diagram of a chip layout of a transmission filter chip.

FIG. 23A illustrates a layout diagram of a transmission filter chip. As illustrated in FIG. 23A, the transmission filter chip includes an input terminal 83a, a four-stage ladder filter 83b, an output terminal 83c, and a ground terminal 83d.

Figure 23B:
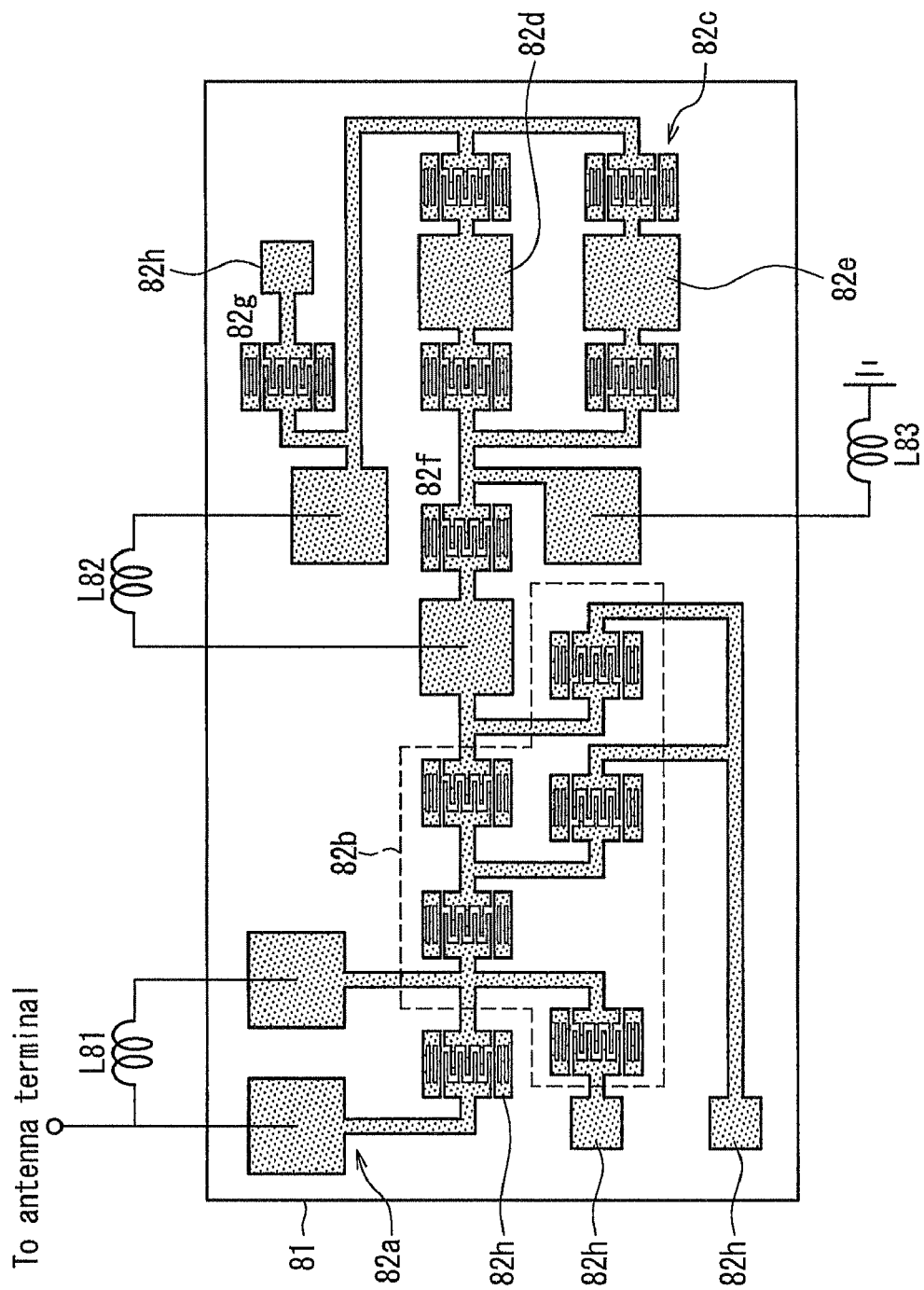
FIG. 23B is a schematic diagram of a chip layout of a reception filter chip.

FIG. 23B illustrates a layout diagram of a reception filter chip. As illustrated as FIG. 23B, the reception filter chip includes a ladder filter 82b, a lattice filter 82c, and a matching circuit resonator 82h on a one-chip piezoelectric substrate 81. In addition, as the capacitors of the lumped constant balun, two IDT capacitors of the present embodiment (resonators 82f and 82o have been formed on the same chip. Here, the grating pitch $\lambda_{cap}$ of the IDT capacitors of the present embodiment has been set such that expression 4 is satisfied. Two inductors L82 and L83 of the lumped constant balun connect to the outside of the filter chip.

Figure 24:
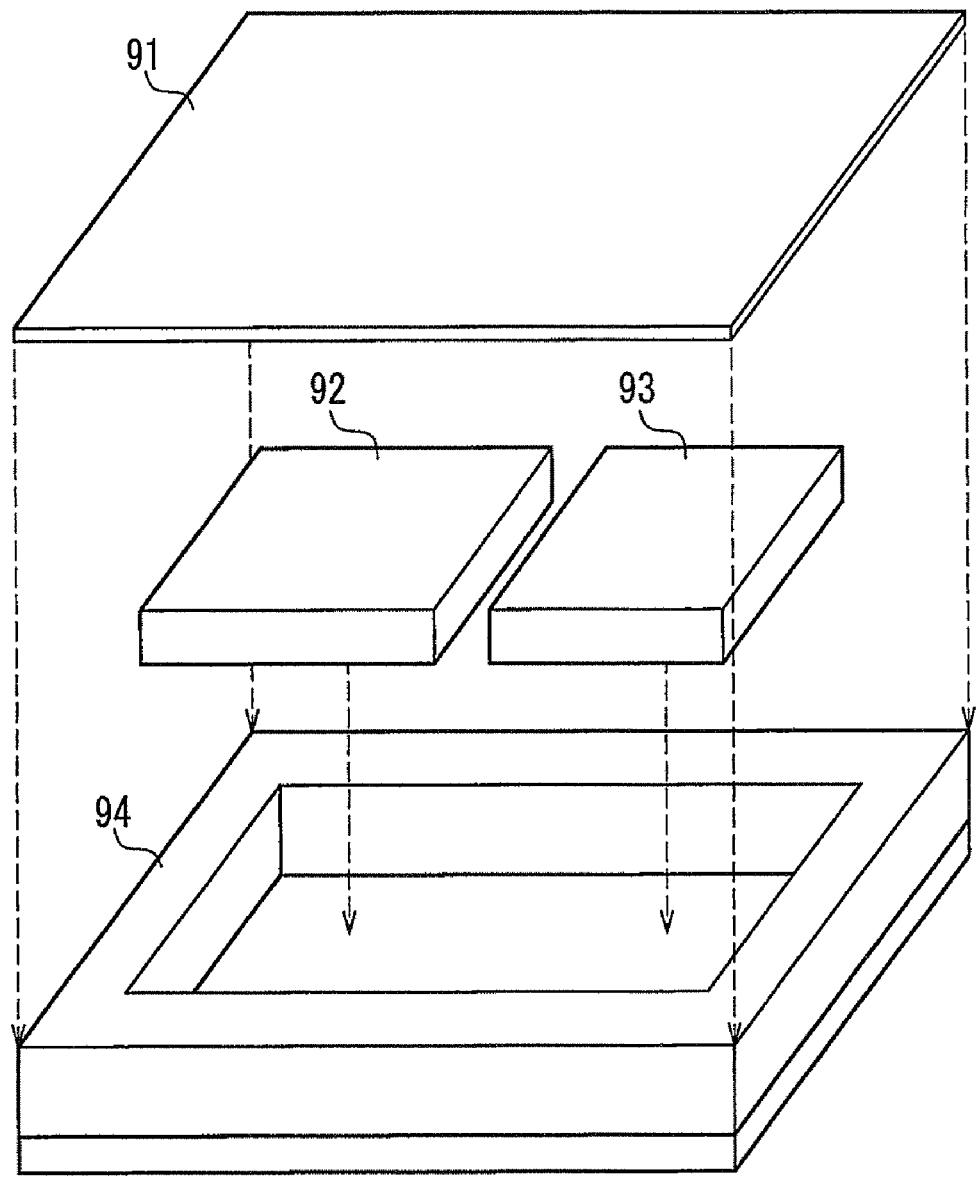
FIG. 24 is a perspective view of a balance filter chip.

FIG. 24 illustrates the package structure of a balance duplexer that includes the filter chip of the second working example. As illustrated in FIG. 24, the balance duplexer is realized by flip-chip mounting a reception filter chip 92 and a transmission filter chip 93 that include the balance filters illustrated as FIGS. 23A and 23B in a cavity-type ceramic package 94, and then performing hermitic sealing with use of a metal lid 91, thus packaging the filter chips.

Figure 25:
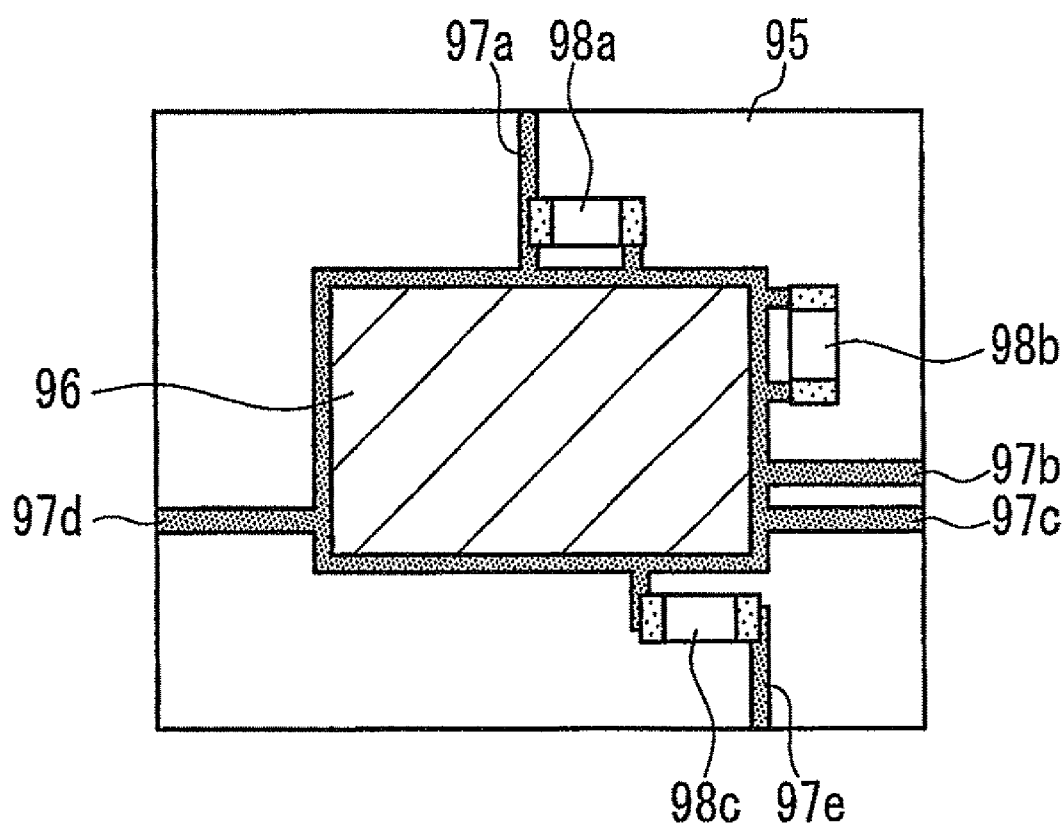
FIG. 25 is a plan view of a print substrate on which a balance filter chip has been mounted.

FIG. 25 is a plan view of a print substrate on which the duplexer package illustrated as FIG. 24 has been mounted. As illustrated in FIG. 25, a duplexer package 96 having the structure illustrated as FIG. 24 is solder-mounted onto a print substrate 95. In addition, a package matching circuit inductor 98a, a balun series inductor 98b, and a balun parallel inductor 98c are realized by chip inductors, and are solder-mounted onto the print substrate 95. Also included on the print substrate 95 are an antenna terminal 97a connected to an antenna, output terminals 97b and 97c connected to a reception circuit, an input terminal 97d connected to a transmission circuit, and a ground terminal 97e. The use of this structure improves the capacitor Q value of the lumped constant balun, thus enabling the realization of a duplexer package that is superior in terms of low-loss.

[5. Communication Module Configuration]

Figure 26:
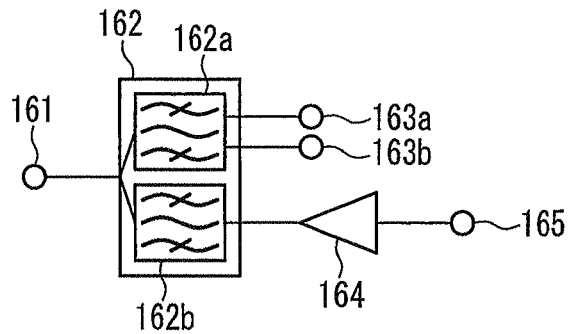
FIG. 26 is a block diagram of a communication module.

FIG. 26 illustrates an exemplary communication module that includes a high frequency devices or filter according to the present embodiment. As illustrated in FIG. 26, a duplexer 162 includes a reception filter 162a and a transmission filter 162b. Also, the reception filter 162a is connected to, for example, reception terminals 163a and 163b that are compatible with balanced output. Furthermore, the transmission filter 162b is connected to a transmission terminal 165 via a power amplifier 164. Here, the duplexer 162 can be realized by a duplexer that includes a high frequency device or filter according to the present embodiment.

When performing reception operations, the reception filter 162a receives an input of reception signals via the antenna terminal 161, passes only signals in a predetermined frequency band, and outputs such signals to the outside via the reception terminals 163a and 163b. Also, when performing transmission operations, the transmission filter 162b receives, from the transmission terminal 165, an input of transmission signals that have been amplified by the power amplifier 164, passes only signals in a predetermined frequency band, and outputs such signals to the outside via the antenna terminal 161.

By including a duplexer that includes a high frequency device and/or filter according to the present invention in the communication module, it is possible to realize a low-loss communication module.

Note that the communication module illustrated as FIG. 26 is exemplary, and the same effects can be obtained even if a high frequency device according to the present embodiment is included in a communication module having another form.

[6. Communication Apparatus Configuration]

Figure 27:
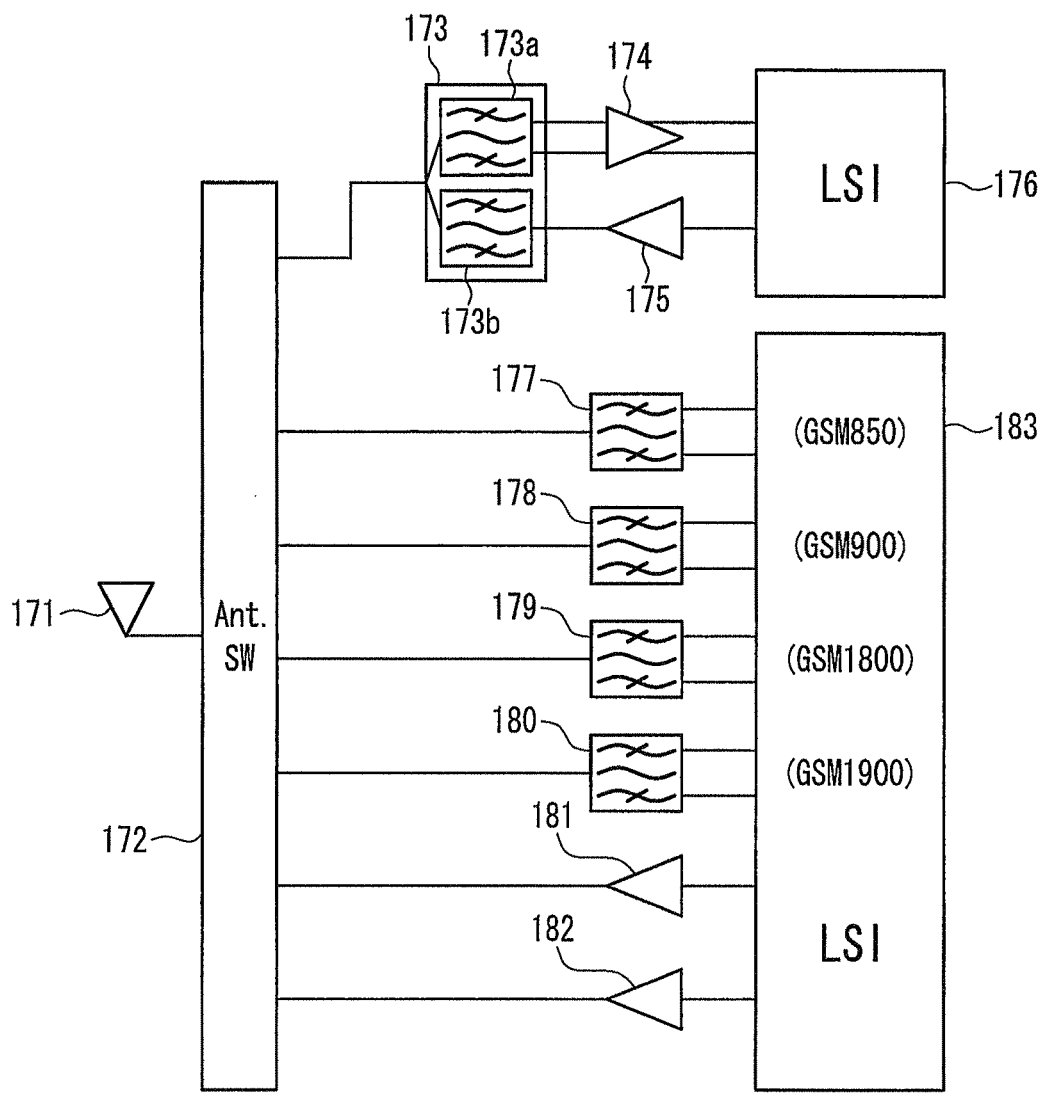
FIG. 27 is a block diagram of a communication apparatus.

FIG. 27 illustrates an RF block of a mobile phone terminal as one example of a communication apparatus including a high frequency device, filter, duplexer, or the above-described communication module according to the present embodiment. In addition, the configuration illustrated as FIG. 27 is a configuration of a mobile phone terminal that is compatible with the GSM (Global System for Mobile Communications) communication system and the W-CDMA (Wideband Code Division Multiple Access) communication system. The GSM communication system in the present embodiment is compatible with the 850 MHz band, the 950 MHz band, the 1.8 GHz band, and the 1.9 GHz band. In addition to the configuration illustrated as FIG. 27, the mobile phone terminal includes a microphone, a speaker, a liquid crystal display, and the like, but these members have been omitted from FIG. 27 since they are not necessary to the description of the present embodiment. A duplexer 173 is a duplexer that includes a high frequency device according to the present embodiment.

First, a reception signal is received as input via an antenna 171, and in accordance with whether the communication system of the reception signal is W-CDMA or GSM, an antenna switch circuit 172 selects an LSI that is to perform operations on the reception signal. If the input reception signal is compatible with the W-CDMA communication system, the antenna switch circuit 172 performs switching so that the reception signal is output to the duplexer 173. The reception signal input to the duplexer 173 is limited to a predetermined frequency band by a reception filter 173a, and the resulting balanced reception signal is output to an LNA 174. The LNA 174 amplifies the input reception signal, and outputs the amplified reception signal to an LSI 176. In the LSI 176, processing for demodulation to an audio signal is performed based on the input reception signal, and the operation of units in the mobile phone terminal is controlled.

However, in the case of transmitting a signal, the LSI 176 generates a transmission signal. The generated transmission signal is amplified by a power amplifier 175 and output to a transmission filter 173b. The transmission filter 173b receives an input of transmission signals, and passes only signals that are in a predetermined frequency band. The transmission signals output from the transmission filter 173b are output to the antenna switch circuit 172, and then output to the outside via the antenna 171.

If the input reception signal is a signal compatible with the GSM communication system, the antenna switch circuit 172 selects one filter from among reception filters 177 to 180 in accordance with the frequency band of the input reception signal, and outputs the input reception signal to the selected filter. The bandwidth of the reception signal is limited by one of the reception filters 177 to 180, and then input to an LSI 183. The LSI 183 performs processing for demodulation to an audio signal based on the input reception signal, and controls the operation of units in the mobile phone terminal. However, in the case of transmitting a signal, the LSI 183 generates a transmission signal. The generated transmission signal is amplified by a power amplifier 181 or 182, output to the antenna switch circuit 172, and then output to the outside via the antenna 171.

By including a high frequency device, filter, duplexers or a communication module according to the present embodiment in the communication apparatus, it is possible to realize a low-loss communication apparatus.

[7. Effects of the Embodiment and Other Remarks]

According to the present embodiment, in a filter that includes capacitors, by realizing the capacitors with resonators (IDT capacitors) and also setting the resonance frequency of the IDT capacitors higher than the passband frequency of the filter, the capacitor Q value is improved, thus enabling the realization of a balance filter that is superior in terms of low-loss.

Also, by including resonators (IDT capacitors) that function as capacitors in a lumped constant balun included in a filter or a duplexer, and furthermore setting the resonance frequency of the IDT capacitors higher than the passband frequency of the filter, the capacitor Q value is improved, thus enabling the realization of a balance filter that is superior in terms of low-loss.

All examples and conditional language recited herein are intended for pedagogical purposes to aid the reader in understanding the principles of the invention and the concepts contributed by the inventor to furthering the art, and are to be construed as being without limitation to such specifically recited examples and conditions, nor does the organization of such examples in the specification relate to a showing of the superiority and inferiority of the invention. Although the embodiment of the present invention has been described in detail, it should be understood that the various changes, substitutions, and alterations could be made hereto without departing from the spirit and scope of the invention.

What is claimed is:

1. A high frequency device comprising:
   a conversion circuit that converts unbalanced input to balanced output; and
   a filter circuit connected to the balanced output of the conversion circuit,
   wherein the conversion circuit includes an inductor and a resonator, and
   the resonance frequency of the resonator included in the conversion circuit is higher than the passband frequency of the filter circuit, and
   wherein the relationship $FR > 1.138 \times F_{UP}$ is satisfied, where $F_{UP}$ is the passband upper end frequency of the filter circuit, and FR is the resonance frequency of the resonator included in the conversion circuit.

2. The high frequency device according to claim 1,
   wherein the filter circuit includes one or more series resonators that are series-connected to a signal line, and one or more parallel resonators that are parallel-connected to the signal line, and
   the relationship $\lambda_{IDT} > 1.138 \times \lambda_{cap}$ is satisfied,
   $\lambda_{IDT}$ is the grating pitch of an interdigital transducer of, among the one or more series resonators, the series resonator having the widest grating pitch, and $\lambda_{cap}$ is the grating pitch an interdigital transducer of the resonator included in the conversion circuit.

3. The high frequency device according to claim 1, wherein FR is substantially equal to $1.138 \times F_{UP}$.

4. A filter comprising;
   a ladder filter in which a plurality of resonators are connected in a ladder configuration between an unbalanced input terminal and an unbalanced output terminal;

a conversion circuit including an unbalanced input terminal connected to the unbalanced output terminal of the ladder filter, a balanced output terminal, and an inductor and a resonator that are connected between the unbalanced input terminal and the balanced output terminal; and a lattice filter including a balanced input terminal connected to the balanced output terminal of the conversion circuit, a balanced output terminal, and a plurality of resonators that are connected in a lattice configuration between the balanced input terminal and the balanced output terminal, wherein the resonance frequency of the resonator included in the conversion circuit is higher than the passband frequency of the ladder filter and the lattice filter, and wherein the relationship $FR > 1.138 \times F_{UP}$ is satisfied, where $F_{UP}$ is the passband upper end frequency of the lattice filter, and FR is the resonance frequency of the resonator included in the conversion circuit.

5. The high frequency device according to claim 4, wherein FR is substantially equal to $1.138 \times F_{UP}$.

6. A duplexer comprising:
a conversion circuit that converts unbalanced input to balanced output; and
a filter circuit connected to the balanced output of the conversion circuit,
wherein the conversion circuit includes an inductor and a resonator, and
the resonance frequency of the resonator included in the conversion circuit is higher than the passband frequency of the filter circuit, and
wherein the relationship $FR > 1.138 \times F_{UP}$ is satisfied, where $F_{UP}$ is the passband upper end frequency of the filter circuit, and FR is the resonance frequency of the resonator included in the conversion circuit.

7. The high frequency device according to claim 6, wherein FR is substantially equal to $1.138 \times F_{UP}$.

8. A duplexer comprising:
a reception filter that extracts a signal in a predetermined frequency band from a reception signal received as input;
a transmission filter that extracts a signal in a predetermined frequency band for external output; and
a matching circuit that matches the phase of a signal on the reception filter side and the phase of a signal on the transmission filter side, wherein the reception filter includes:
a ladder filter in which a plurality of resonators are connected in a ladder configuration between an unbalanced input terminal and an unbalanced output terminal;
a conversion circuit including an unbalanced input terminal connected to the unbalanced output terminal of the ladder filter, a balanced output terminal, and an inductor and a resonator that are connected between the unbalanced input terminal and the balanced output terminal; and
a lattice filter including a balanced input terminal connected to the balanced output terminal of the conversion circuit, a balanced output terminal, and a plurality of resonators that are connected in a lattice configuration between the balanced input terminal and the balanced output terminal, and
the resonance frequency of the resonator included in the conversion circuit is higher than the passband frequency of the ladder filter and the lattice filter, and
wherein the relationship $FR > 1.138 \times F_{UP}$ is satisfied, where $F_{UP}$ is the passband upper end frequency of the lattice filter, and FR is the resonance frequency of the resonator included in the conversion circuit.

9. The high frequency device according to claim 8, wherein FR is substantially equal to $1.138 \times F_{UP}$.

10. A communication apparatus comprising a transmission filter and a reception filter,
wherein at least one of the transmission filter and the reception filter includes:
a conversion circuit that converts unbalanced input to balanced output; and
a filter circuit connected to the balanced output of the conversion circuit,
the conversion circuit includes an inductor and a resonator, and
the resonance frequency of the resonator included in the conversion circuit is higher than the passband frequency of the filter circuit, and
wherein the relationship $FR > 1.138 \times F_{UP}$ is satisfied, where $F_{UP}$ is the passband upper end frequency of the filter circuit, and FR is the resonance frequency of the resonator included in the conversion circuit.

11. The high frequency device according to claim 10, wherein FR is substantially equal to $1.138 \times F_{UP}$.

* * * * *

UNITED STATES PATENT AND TRADEMARK OFFICE
CERTIFICATE OF CORRECTION

| | |
|---|---|
| PATENT NO. | : 8,350,643 B2 |
| APPLICATION NO. | : 12/571205 |
| DATED | : January 8, 2013 |
| INVENTOR(S) | : Shogo Inoue et al. |

It is certified that error appears in the above-identified patent and that said Letters Patent is hereby corrected as shown below:

Title page, item (75) Inventors, the name of the fourth inventor reading "Masufumi Iwaki" should be changed to --Masafumi Iwaki--.

Title page, item (75) Inventors, the city of residence of the sixth inventor, Masanori Ueda, reading "Yokohama" should be changed to --Kawasaki--.

Signed and Sealed this
Twenty-first Day of May, 2013

Teresa Stanek Rea
*Acting Director of the United States Patent and Trademark Office*